(12) United States Patent
Lee et al.

(10) Patent No.: US 11,024,772 B2
(45) Date of Patent: Jun. 1, 2021

(54) LIGHT EMITTING DIODE

(71) Applicant: KOREA POLYTECHNIC UNIVERSITY Industry Academic Cooperation Foundation, Siheung-si (KR)

(72) Inventors: Sung-Nam Lee, Incheon (KR); Seung-Hye Baek, Seoul (KR)

(73) Assignee: KOREA POLYTECHNIC UNIVERSITY INDUSTRY ACADEMIC COOPERATION FOUNDATION, Gyeonggi-Do (KR)

(*) Notice: Subject to any disclaimer, the term of this patent is extended or adjusted under 35 U.S.C. 154(b) by 0 days.

(21) Appl. No.: 16/549,481

(22) Filed: Aug. 23, 2019

(65) Prior Publication Data

US 2020/0381591 A1 Dec. 3, 2020

(30) Foreign Application Priority Data

May 29, 2019 (KR) .................. 10-2019-0063110

(51) Int. Cl.
*H01L 33/38* (2010.01)
*H01L 33/42* (2010.01)
(Continued)

(52) U.S. Cl.
CPC .......... *H01L 33/382* (2013.01); *H01L 27/15* (2013.01); *H01L 33/0008* (2013.01);
(Continued)

(58) Field of Classification Search
CPC ............ H01L 27/146; H01L 27/14601; H01L 27/14636; H01L 27/14641; H01L 27/14643; H01L 27/14665; H01L 27/14678; H01L 27/15; H01L 27/156; H01L 27/32; H01L 27/3241; H01L 27/3244; H01L 27/3248; H01L 33/0008; H01L 33/0016; H01L 33/20; H01L 33/26; H01L 33/36; H01L 33/38; H01L 33/382; H01L 33/385; H01L 33/387; H01L 33/40;
(Continued)

(56) References Cited

U.S. PATENT DOCUMENTS 8,796,714 B2 8/2014 Grolier et al.
2012/0112226 A1* 5/2012 Grolier ................ H01L 33/382
257/98

(Continued)

FOREIGN PATENT DOCUMENTS

JP 2012-525690 A 10/2012
KR 101678763 B1 12/2016

OTHER PUBLICATIONS

Korean Office Action dated May 22, 2020 issued in corresponding Korean Application No. 10-2019-0063110.

*Primary Examiner* — Cheung Lee
(74) *Attorney, Agent, or Firm* — Harness, Dickey & Pierce, P.L.C.

(57) ABSTRACT

Provided is a light emitting diode. The light emitting diode includes a substrate, a first semiconductor layer on the substrate, an active layer on the first semiconductor layer, a second semiconductor layer on the active layer, and a conductor passing through the second semiconductor layer and the active layer to contact the first semiconductor layer.

16 Claims, 21 Drawing Sheets

(51) Int. Cl.
 *H01L 33/20* (2010.01)
 *H01L 33/26* (2010.01)
 *H01L 27/15* (2006.01)
 *H01L 33/00* (2010.01)

(52) U.S. Cl.
 CPC .............. *H01L 33/20* (2013.01); *H01L 33/26* (2013.01); *H01L 33/42* (2013.01)

(58) Field of Classification Search
 CPC ....... H01L 33/405; H01L 33/42; H01L 51/52; H01L 51/5203; H01L 51/525
 See application file for complete search history.

(56) References Cited

U.S. PATENT DOCUMENTS

2013/0334551 A1   12/2013  Lee et al.
2017/0288088 A1*  10/2017  Won Cheol ............. H01L 33/62

\* cited by examiner

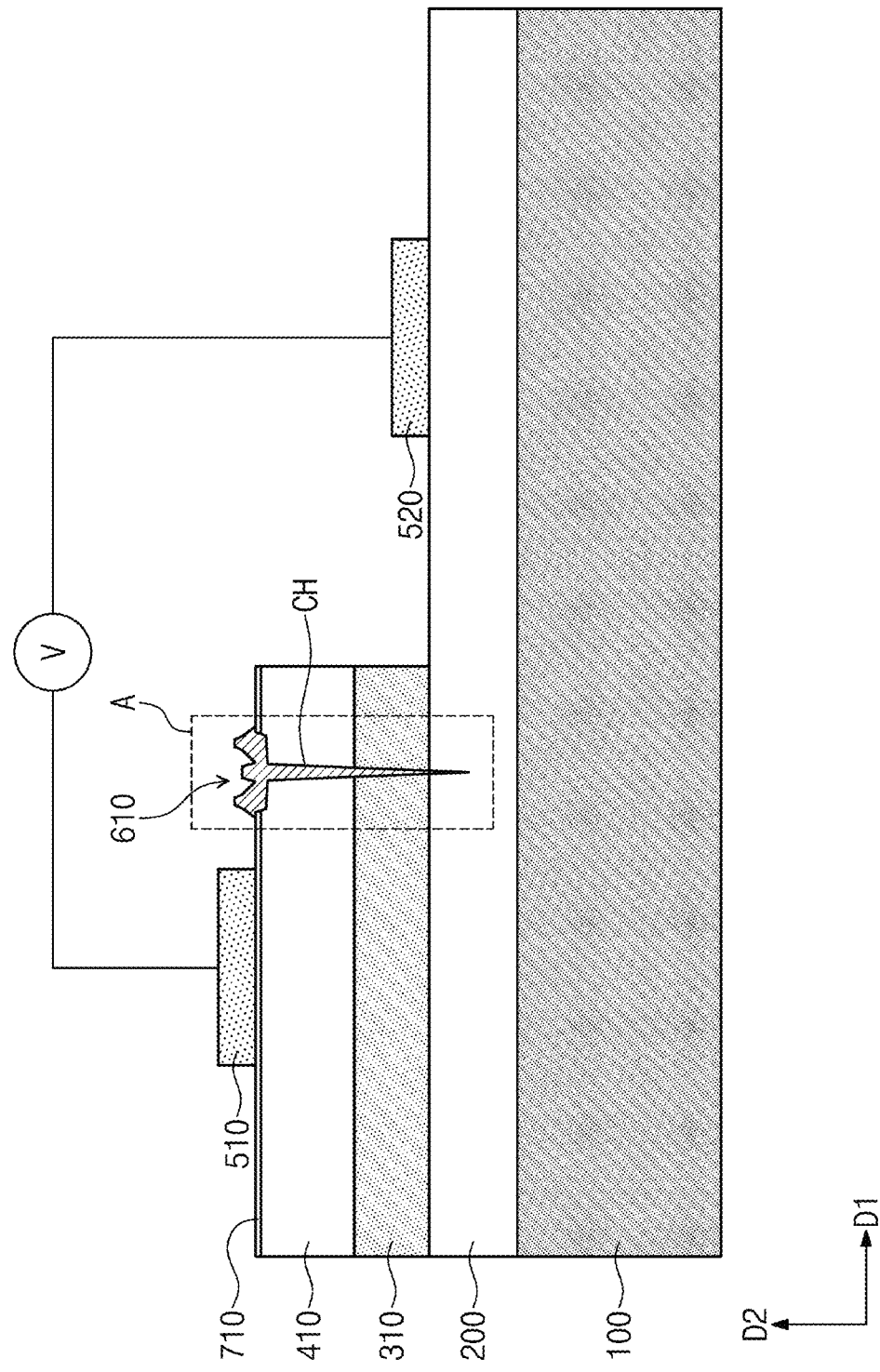

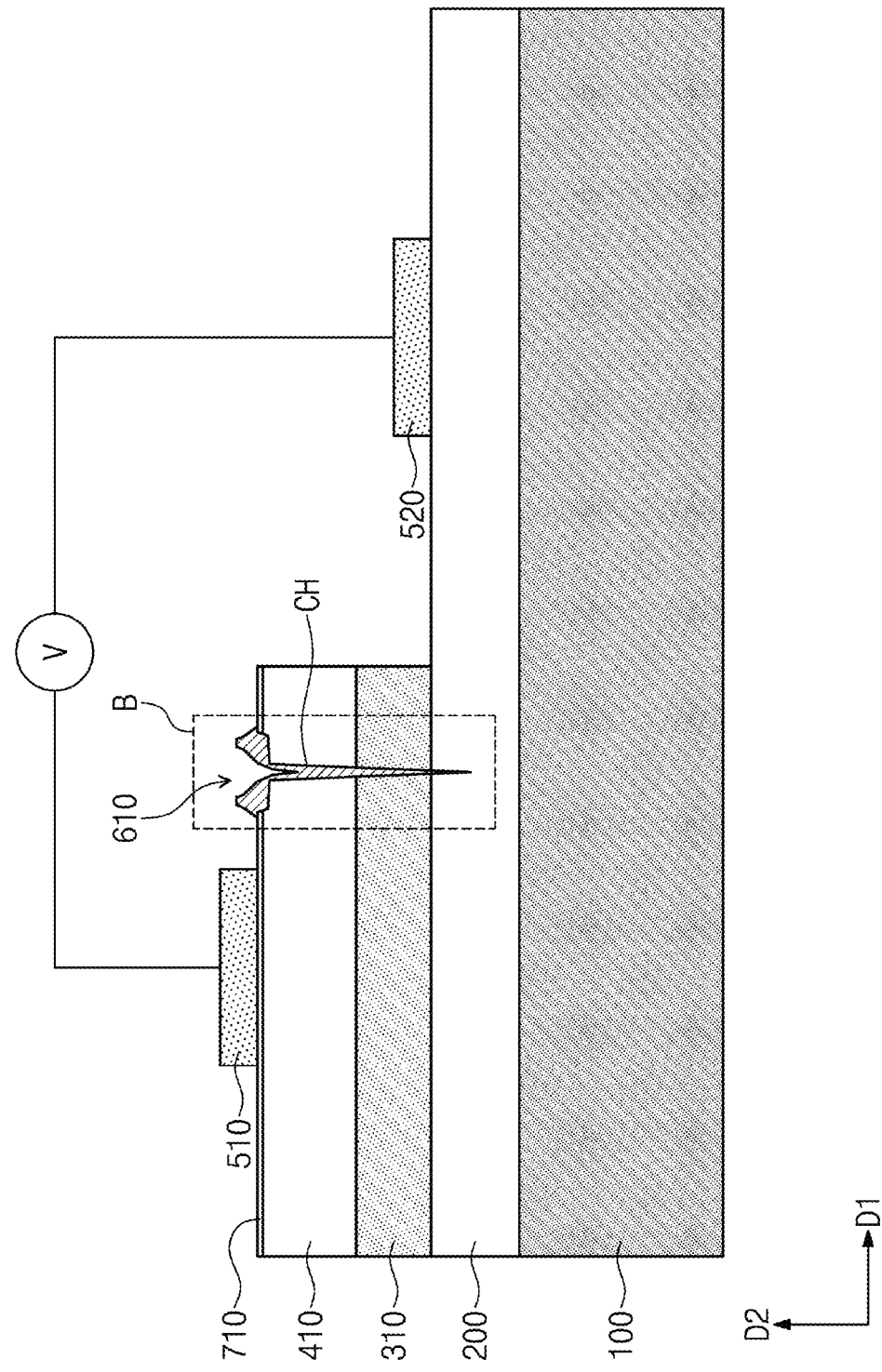

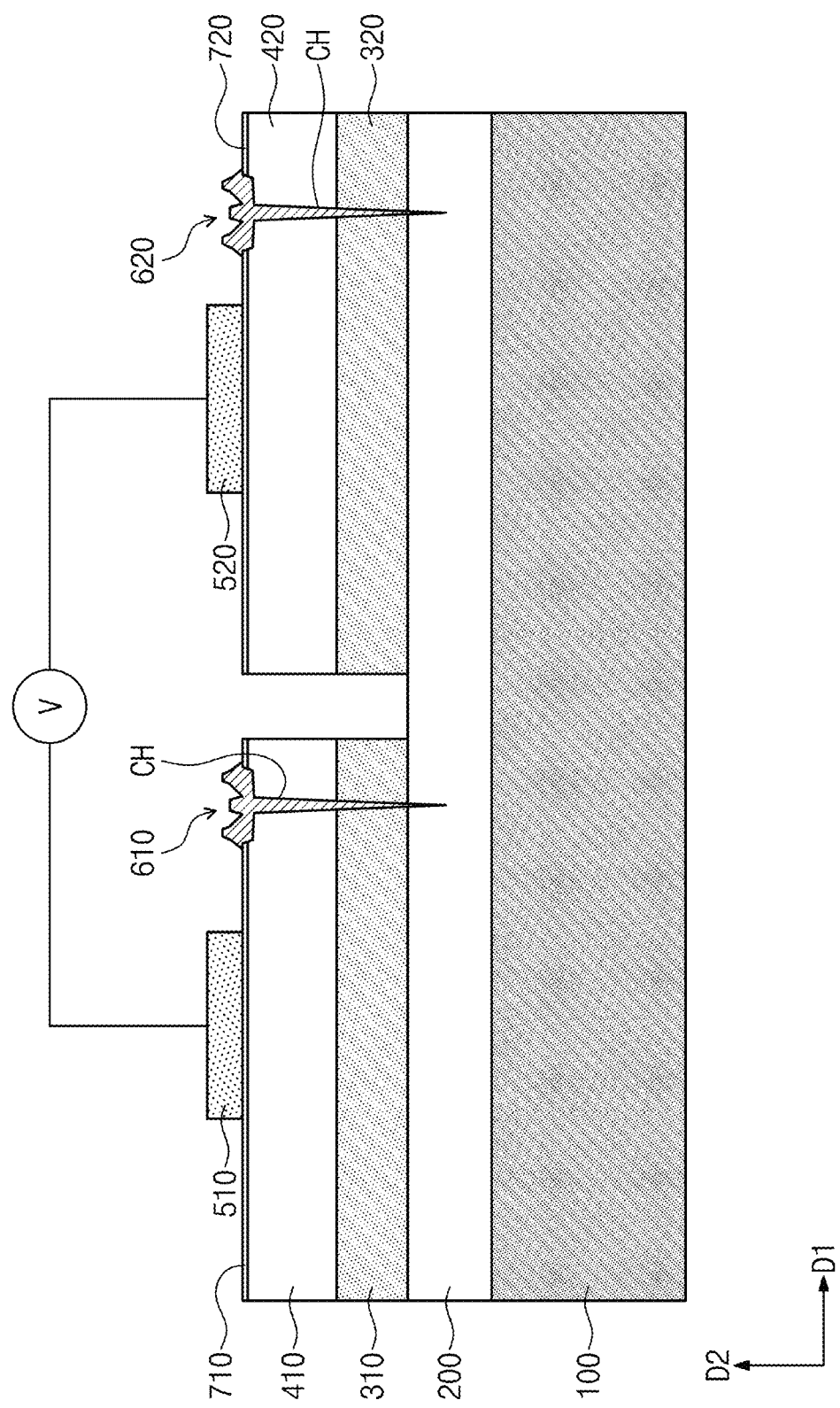

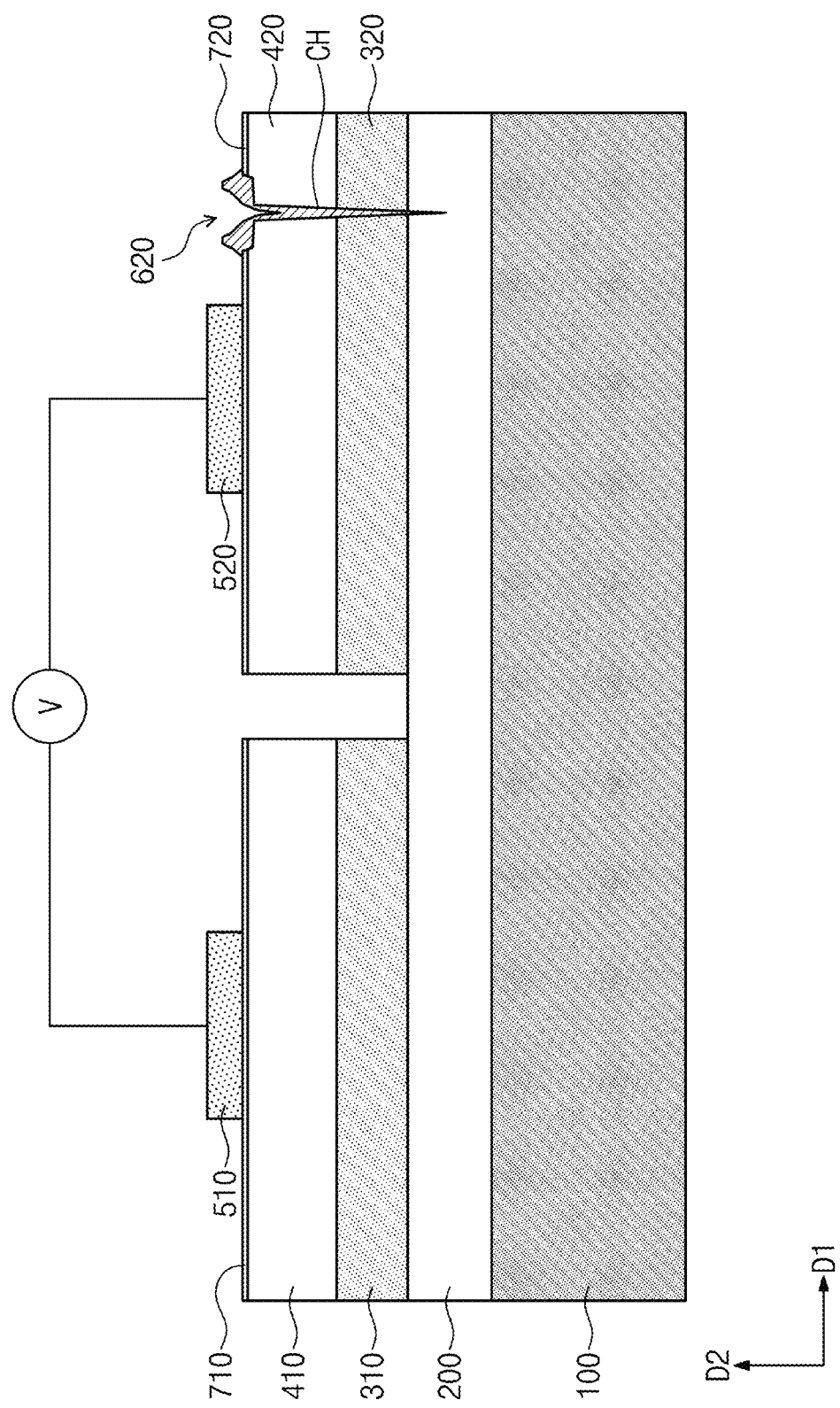

LIGHT EMITTING DIODE

CROSS-REFERENCE TO RELATED APPLICATIONS

This U.S. non-provisional patent application claims priority under 35 U.S.C. § 119 of Korean Patent Application No. 10-2019-0063110, filed on May 29, 2019, the entire contents of which are hereby incorporated by reference.

BACKGROUND

The present disclosure herein relates to a light emitting diode. More particularly, the present disclosure herein relates to a light emitting diode including a conductor.

Light emitting diodes (LEDs) are a type of diode made of semiconductors. Such an LED may emit light by using a principle in which current is injected in only one direction, and a portion of the current is converted into light by recombination of electrons and holes when a voltage is applied to terminals of both electrodes.

The LED may be generally manufactured through an n-p junction using an N-type semiconductor and a P-type semiconductor. The LED has a structure in which the electrons supplied to the N-type semiconductor, and the holes are supplied to the P-type semiconductor so that the electrons and the holes are recombined with each other at the junction to emit light when a forward bias is applied to the LED.

SUMMARY

The present disclosure provides a light emitting diode that is capable of emitting light by DC and AC powers.

An embodiment of the inventive concept provides a light emitting diode including: a substrate; a first semiconductor layer on the substrate; an active layer on the first semiconductor layer; a second semiconductor layer on the active layer; and a conductor passing through the second semiconductor layer and the active layer to contact the first semiconductor layer.

In an embodiment of the inventive concept, a light emitting diode includes: a substrate; a first semiconductor layer on the substrate; first and second active layers disposed on the first semiconductor layer and spaced apart from each other; a second semiconductor layer on the first active layer; a third semiconductor layer on the second active layer; a first conductor passing through the second semiconductor layer and the first active layer and electrically connected to the first semiconductor layer; and a second conductor passing through the third semiconductor layer and the second active layer and electrically connected to the first semiconductor layer.

In an embodiment of the inventive concept, a light emitting diode includes: a substrate; a first semiconductor layer on the substrate; first and second active layers disposed on the first semiconductor layer and spaced apart from each other; a second semiconductor layer on the first active layer; a third semiconductor layer on the second active layer; a first metal electrode on the second semiconductor layer; a second metal electrode on the third semiconductor layer; and a conductor configured to electrically connect the first metal electrode to the first semiconductor layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1A is a cross-sectional view of a first light emitting diode according to an embodiment of the inventive concept;

FIG. 3A is a cross-sectional view of a second light emitting diode according to an embodiment of the inventive concept;

FIG. 8 is a cross-sectional view of a third light emitting diode according to an embodiment of the inventive concept;

FIG. 14 is a cross-sectional view of a seventh light emitting diode according to an embodiment of the inventive concept.

DETAILED DESCRIPTION

Figure 1B:
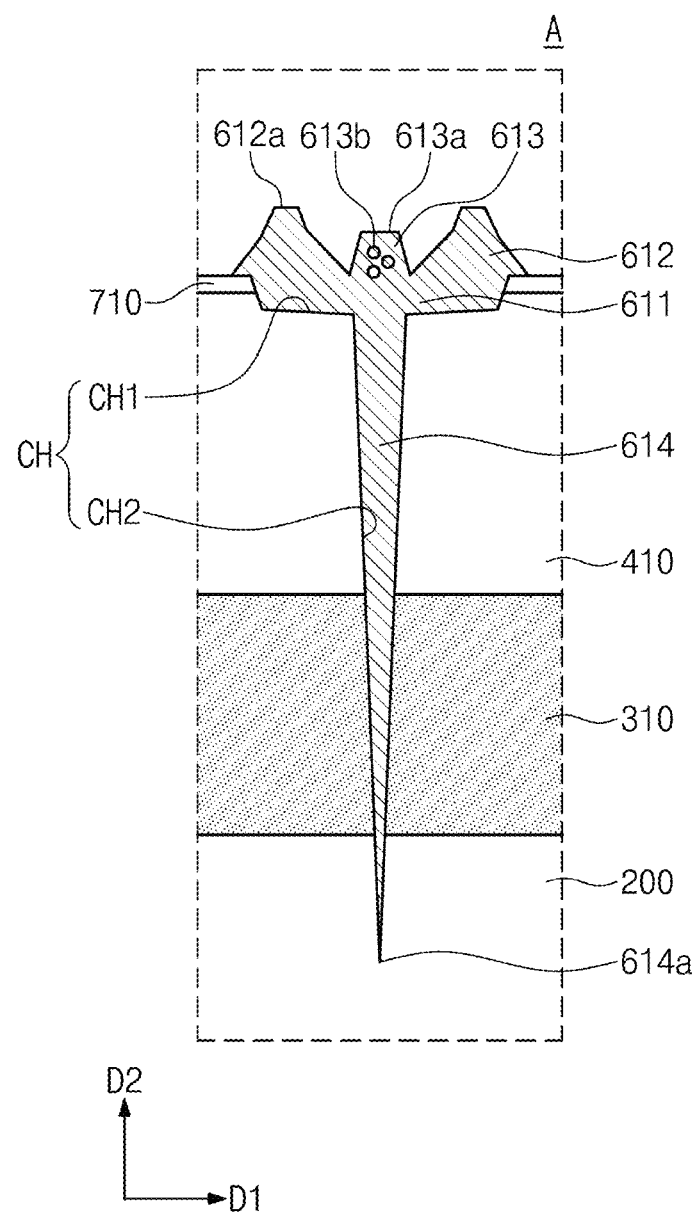
FIG. 1B is an enlarged view of an area A of FIG. 1A.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the present invention. In this specification, the terms of a singular form may comprise plural forms unless specifically mentioned. The meaning of 'comprises' and/or 'comprising' specifies a component, a step, an operation and/or an element does not exclude other components, steps, operations and/or elements. Hereinafter, embodiments according to the inventive concept will be described in detail.

Figure 1C:
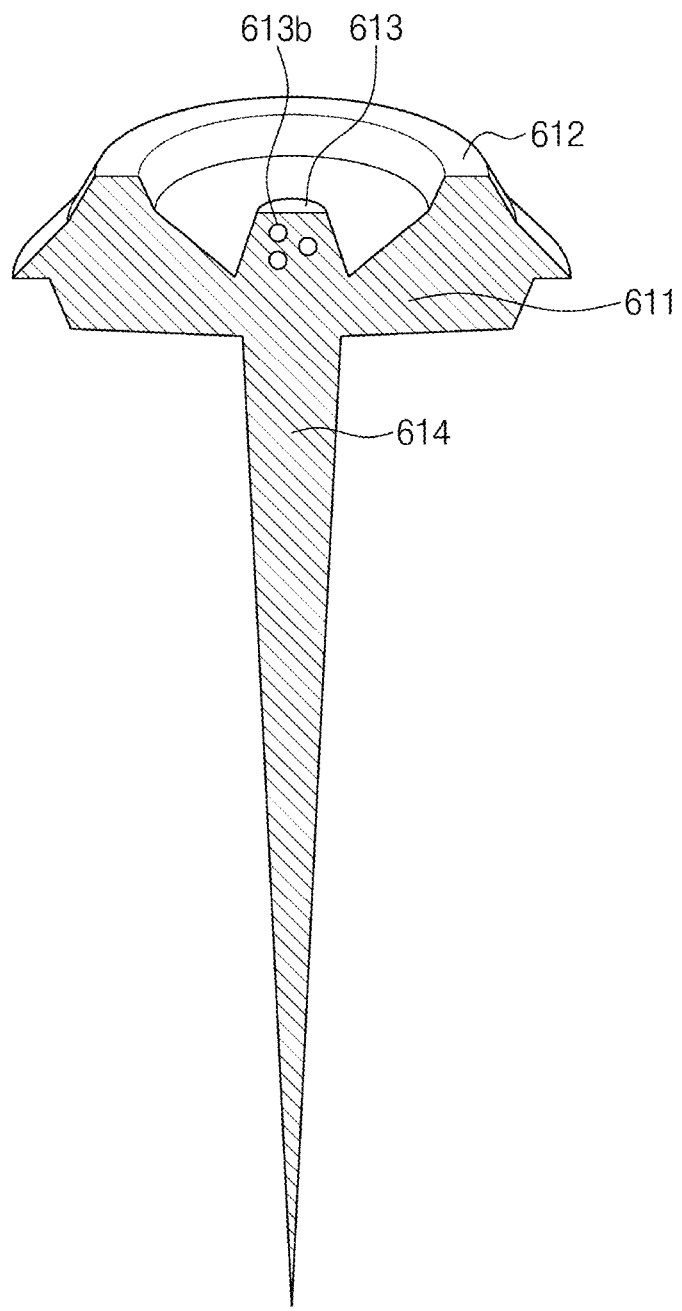
FIG. 1C is a cross-sectional perspective view illustrating a conductor of the first light emitting diode.

FIG. 1A is a cross-sectional view of a first light emitting diode according to an embodiment of the inventive concept. FIG. 1B is an enlarged view of an area A of FIG. 1A. FIG. 1C is a cross-sectional perspective view illustrating a conductor of the first light emitting diode.

Referring to FIGS. 1A, 1B, and 1C, the first light emitting diode according to the present embodiment may include a substrate 100, a first semiconductor layer 200, a second semiconductor layer 410, an active layer 310, a first metal electrode 510, a second metal electrode 520, a conductor 610, a transparent electrode 710, and a channel CH.

The first semiconductor layer 200 may be disposed on the substrate 100. For example, the substrate 100 may include at least one of sapphire, diamond, InP, AlGaN, LiAlO2, InN, GaP, Ge, InAs, AlAs, SiO2, Si, SiC, GaN, or GaAs.

For example, the first semiconductor layer 200 may include at least one of GaN, GaAs, GaSb, AlN, AlP, AlAs, AlSb, InN, InP, InAs, InSb, AlGaN, AlGaP, AlGaAs, AlGaSb, InGaN, GaInP, GaInAs, GaInSb, AlInN, AlInP, AlInAs, AlInSb, AlGaInN, AlGaInP, AlGaInAs, or AlGaInSb.

The active layer 310 may be disposed on the first semiconductor layer 200. The active layer 310 may be an area on which light is generated. The active layer 310 may have a single or multiple quantum well structure. For example, the active layer 310 may include at least one of GaN, GaP, GaAs, GaSb, AlN, AlP, AlAs, AlSb, InN, InP, InAs, InSb, AlGaN, AlGaP, AlGaAs, AlGaSb, InGaN, GaInP, GaInAs, GaInSb, AlInN, AlInP, AlInAs, AlInSb, AlGaInN, AlGaInP, AlGaInAs, or AlGaInSb. For example, the multiple quantum well structure may include at least one of AlN/AlGaN, AlN/GaN, AlN/InGaN, AlN/InN, AlN/AlGaInN, AlGaN/GaN, AlGaN/InGaN, AlGaN/AlGaInN, GaN/InGaN, GaN/InN, AlGaInN/InGaN, AlGaInN/InN, AlP/AlGaP, AlP/GaP, AlP/InGaP, AlP/InP, AlP/AlGaInP, AlGaP/GaP, or AlGaP/InGaP.

The second semiconductor layer 410 may be disposed on the active layer 310. For example, the second semiconductor layer 410 may include at least one of GaN, GaAs, GaSb, AlN, AlP, AlAs, AlSb, InN, InP, InAs, InSb, AlGaN, AlGaP, AlGaAs, AlGaSb, InGaN, GaInP, GaInAs, GaInSb, AlInN, AlInP, AlInAs, AlInSb, AlGaInN, AlGaInP, AlGaInAs, or AlGaInSb.

For example, the first semiconductor layer 200 may be an N-type semiconductor layer, and the second semiconductor layer 410 may be a P-type semiconductor layer. For another example, the first semiconductor layer 200 may be a P-type semiconductor layer, and the second semiconductor layer 410 may be an N-type semiconductor layer. Hereinafter, the structure in which the first semiconductor layer 200 is the N-type semiconductor layer, and the second semiconductor layer 410 is the P-type semiconductor layer will be described.

The transparent electrode 710 may be disposed on the second semiconductor layer 410. For example, the transparent electrode 710 may include at least one of indium tin oxide (ITO), zinc-doped indium tin oxide (ZITO), zinc indium oxide (ZIO), gallium indium oxide (GIO), zinc tinoxide (ZTO), fluorine-doped tin oxide (FTO), aluminum-doped zinc oxide (AZO), gallium-doped zinc oxide (GZO), or transparent conductive oxide (TCO).

The first metal electrode 510 may be disposed on the transparent electrode 710, and the second metal electrode 520 may be disposed on the first semiconductor layer 200. For example, each of the first and second metal electrodes 510 and 520 may include at least one of Co, Ir, Ta, Cr, Mn, Mo, Tc, W, Re, Fe, Sc, Ti, Sn, Ge, Sb, Al, Pt, Ni, or Au.

The active layer 310 and the second metal electrode 520 may be spaced apart from each other on the first semiconductor layer 200 in a first direction D1. The first direction D1 may be a direction that is parallel to a top surface of the substrate 100. The first metal electrode 510 may cover a portion of the top surface of the transparent electrode 710. The active layer 310, the second semiconductor layer 410, the transparent electrode 710, and the first metal electrode 510 may be sequentially laminated on the first semiconductor layer 200 in a second direction D2. The second direction D2 may be a direction that is perpendicular to the top surface of the substrate 100.

The channel CH passing through the transparent electrode 710, the second semiconductor layer 410, and the active layer 310 may be provided.

The conductor 610 passing through the transparent electrode 710, the second semiconductor layer 410, and the active layer 310 and electrically connected to the first semiconductor layer 200 may be provided. The conductor 610 may be filled into the channel CH.

The channel CH and the conductor 610 may be provided by a reverse breakdown phenomenon between the first semiconductor layer 200 and the second semiconductor layer 410. In detail, positive (+) power may be connected to the second metal electrode 520, and negative (−) power may be connected to the first metal electrode 510. Then, when a reverse breakdown voltage (hereinafter, referred to as a breakdown voltage) of the second semiconductor layer 410, the active layer 310, and the first semiconductor layer 200, which are junctioned to each other, is applied, the breakdown phenomenon may occur in the second semiconductor layer 410, the active layer 310, and the first semiconductor layer 200 to provide the channel CH and the conductor 610. The conductor 610 may be made of a metal material contained in the first metal electrode 510 or the transparent electrode 710. That is to say, a portion of the metal material contained in the first metal electrode 510 or the transparent electrode 710 may be filled into the channel CH and thus provided as the conductor 610 by applying the breakdown voltage. For example, the conductor 610 may include at least one of Co, Ir, Ta, Cr, Mn, Mo, Tc, W, Re, Fe, Sc, Ti, Sn, Ge, Sb, Al, Pt, Ni, Au, In, Zn, or Ga. The conductor 610 may electrically connect the first metal electrode 510 to the first semiconductor layer 200.

Referring to FIGS. 1B and 1C, the conductor 610 and the channel Ch will be described in more detail.

The conductor 610 may include a base part 611, an outer protrusion 612, an inner protrusion 613, and a through-part 614. The channel CH may include a first portion CH1 and a second portion CH2.

The first portion CH1 and the second portion CH2 of the channel CH may be provided together with the conductor 610 by the breakdown phenomenon. For example, as illustrated in the drawings, the first portion CH1 of the channel CH may pass through the transparent electrode 710 and be provided by recessing a top surface of the second semiconductor layer 410. For another example, unlike the drawings, the first portion CH1 of the channel CH may pass through the transparent electrode 710, the second semiconductor layer 410, and the active layer 310 and be provided by recessing a top surface of the first semiconductor layer 200.

In view of the plan, the second portion CH2 of the channel CH may be surrounded by the first portion CH1 of the channel CH. The second portion CH2 of the channel CH may have a depth greater than that of the first portion CH1 of the channel CH. The second portion CH2 of the channel CH may pass through the second semiconductor layer 410 and the active layer 310. The lowermost portion of the second portion CH2 of the channel CH may be disposed inside the first semiconductor layer 200.

The base part 611 may have a disc shape. For example, as illustrated in the drawings, the base part 611 may be disposed on the top surface of the second semiconductor layer 410. For another example, unlike the drawings, the base part 611 may be disposed on the top surface of the first semiconductor layer 200. The base part 611 may be disposed inside the first portion CH1 of the channel CH.

The through part 614 may protrude from the base part 611 in a direction opposite to the second direction D2. The through-part 614 may be disposed inside the second portion CH2 of the channel CH. The through-part 614 may pass through the second semiconductor layer 410 and the active layer 310. The through-part 614 may contact the first semiconductor layer 200. The lowermost portion 614a of the through-part 614 may be disposed within the first semiconductor layer 200. The lowermost portion of the base part 611 may have a level higher than that of the lowermost portion 614a of the through-part 614. The through-part 614 may have a width less than that of the base part 611. The through-part 614 may have a height higher than that of the base part 611.

The outer protrusion 612 and the inner protrusion 613 may protrude from the base part 611 in the second direction D2. The inner protrusion 613 may protrude from a central portion of the base part 611, and the outer protrusion 612 may protrude from an edge of the base part 611. The outer protrusion 612 may have a ring shape. In view of the plane, the outer protrusion 612 may surround the inner protrusion 613. The uppermost portion 612a of the outer protrusion 612 may have a level higher than that of the uppermost portion 613a of the inner protrusion 613.

The inner protrusion 613 may include pores 613b. The pores 613b may be provided within the inner protrusion 613. For example, air may be filled in the pores 613b. Electrical conductivity of the inner protrusion 613 may be deteriorated by the pores 613b. That is to say, electrical resistance of the inner protrusion 613 may increase by the pores 613b.

A material forming the conductor 610 may have an uneven lattice structure within the inner protrusion 613. The electrical conductivity of the inner protrusion 613 may be deteriorated by the uneven lattice structure.

The first light emitting diode according to the present embodiment may be connected to DC power and AC power and thus may emit light by the DC power and the AC power.

Figure 2A:
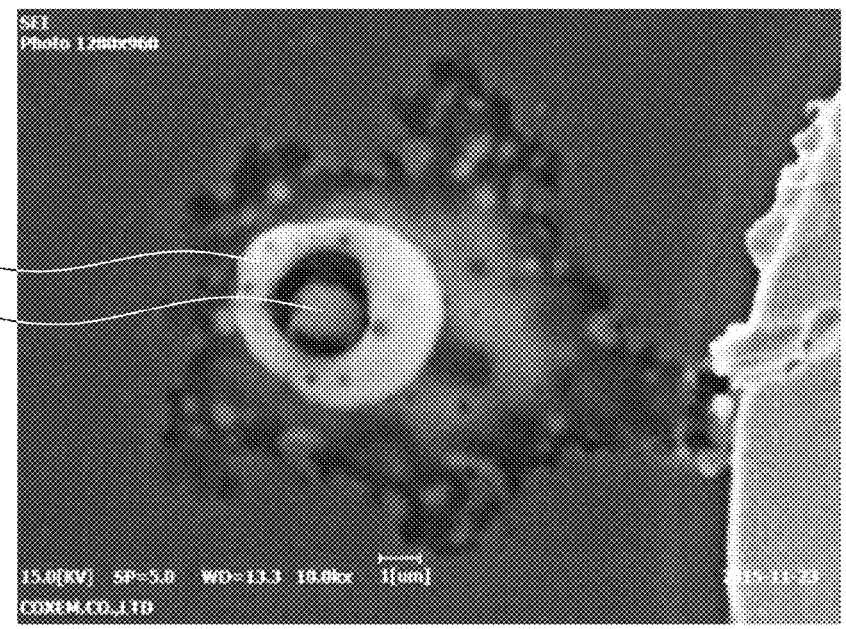
FIGS. 2A and 2B are SEM images of the conductor.
Figure 2B:
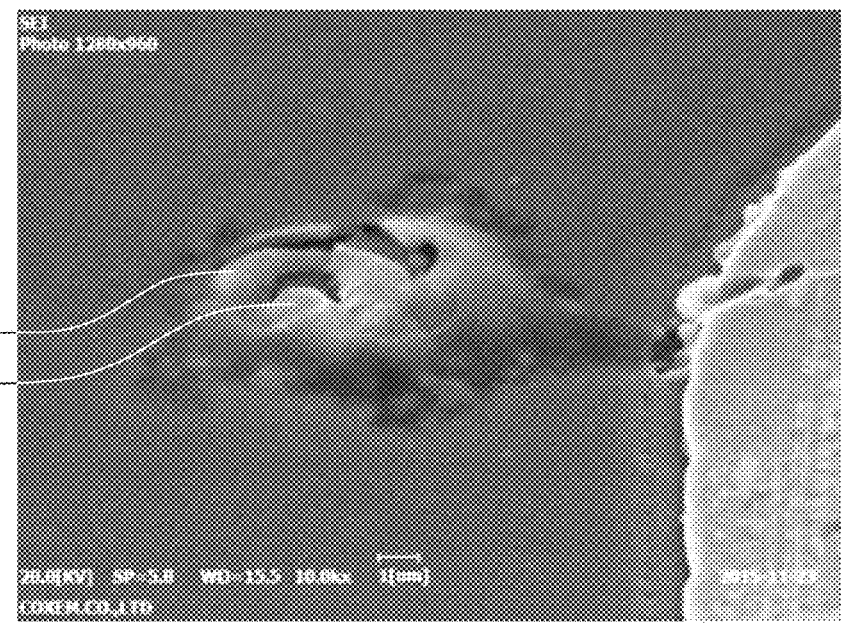

FIGS. 2A and 2B are SEM images of the conductor.

Referring to FIGS. 2A and 2B, it is confirmed that the conductor includes the inner protrusion 613 and the outer protrusion 612.

Figure 3B:
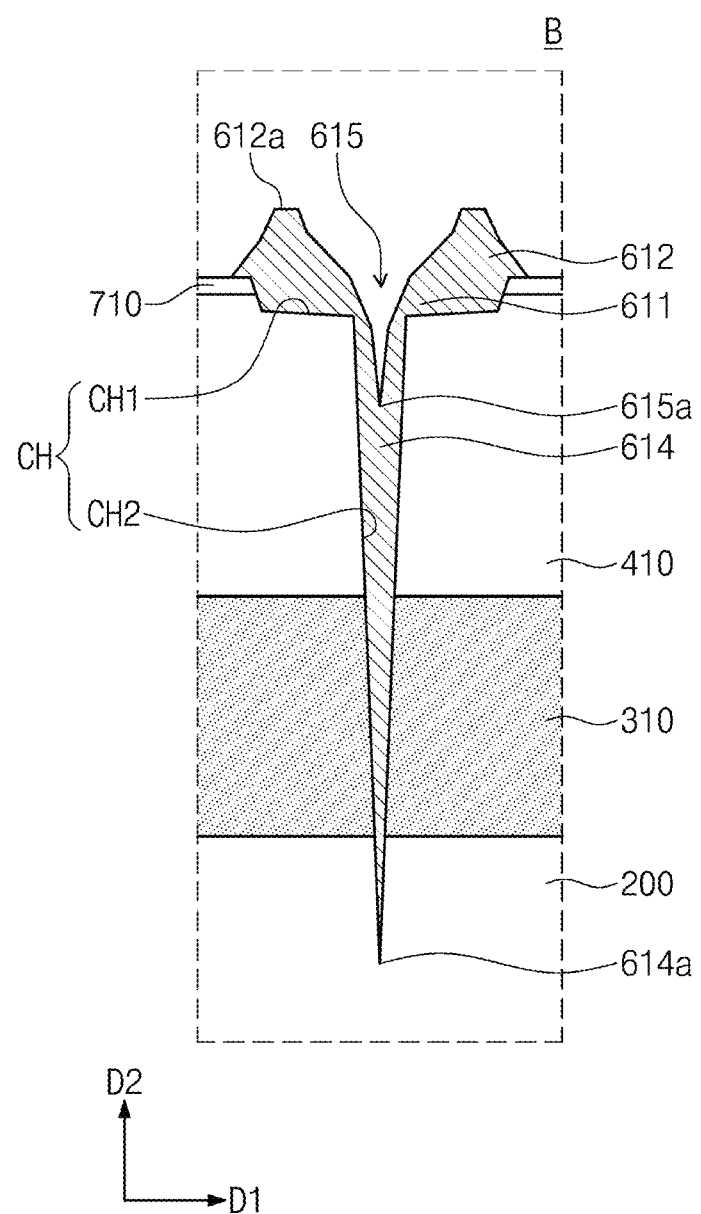
FIG. 3B is an enlarged view of an area B of FIG. 3A.
Figure 3C:
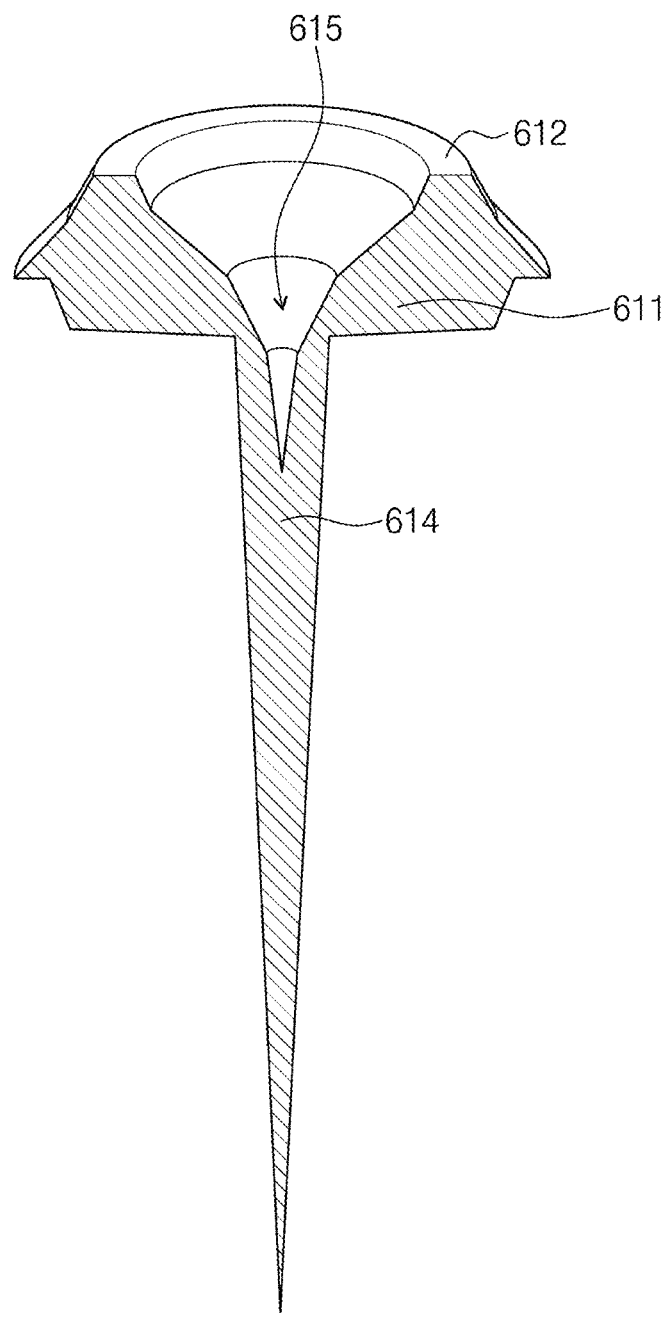
FIG. 3C is a cross-sectional perspective view illustrating a conductor of the second light emitting diode.

FIG. 3A is a cross-sectional view of a second light emitting diode according to an embodiment of the inventive concept. FIG. 3B is an enlarged view of an area B of FIG. 3A. FIG. 3C is a cross-sectional perspective view illustrating a conductor of the second light emitting diode. The second light emitting diode according to the present embodiment is similar to the first light emitting diode described with reference to FIGS. 1A, 1B, and 1C except for following description.

Referring to FIGS. 3A, 3B, and 3C, the conductor 610 may include a recess 615 in an upper portion thereof. The recess 615 may be defined by recessing the top surface of the base part 611 in a direction opposite to the second direction D2. An upper portion of the recess 615 may pass through the base part 611. A lower portion of the recess 615 may be provided within the through-part 614. The lowermost portion 615a of the recess 615 may be provided within the second semiconductor layer 410. That is to say, the lowermost portion 615a of the recess 615 may have a level lower than that of the top surface of the second semiconductor layer 410. The recess 615 may be surrounded by the outer protrusion 612 in a planar manner. The recess 615 may be surrounded by the base part 611 in a planar manner. The conductor 610 may not include an inner protrusion 613.

The second light emitting diode described with reference to FIGS. 3A, 3B, and 3C may be manufactured by applying a recess voltage to the first light emitting diode of FIGS. 1A, 1B, and 1C or by thermally treating the first light emitting diode of FIGS. 1A, 1B, and 1C.

Explaining the applying of the recess voltage, in the first light emitting diode of FIGS. 1A, 1B, and 1C, positive (+) power may be connected to a second metal electrode 520, and negative (−) power may be connected to a first metal electrode 510. Then, the recess voltage is applied, the inner protrusion 613 of the conductor 610 may be removed, and the recess 615 may be defined. The recess voltage may be a voltage greater than a reverse breakdown voltage (hereinafter, referred to a breakdown voltage) of the second semiconductor layer 410, the active layer 310, and the first semiconductor layer 200, which are bonded to each other. For example, the recess voltage may be greater about 15V to about 150 V than the breakdown voltage. A size and shape of the recess 615 may vary according to intensity and applied time of the recess voltage.

Explaining the thermal treatment is described, the conductor 610 may be thermally treated to remove the inner protrusion 613 and to form the recess 615. A size and shape of the recess 615 may vary according to thermal treatment temperature and time.

When the recess voltage is applied, or the recess 615 is formed by the thermal treatment, electrical conductivity of the conductor 610 may be changed. Since the pores 613b of the inner protrusion 613 and the uneven lattice structure are removed, the electrical conductivity of the conductor 610 may be improved. That is to say, the electrical resistance of the conductor 610 may be reduced.

Finally, the manufacturing of the second light emitting diode may include formation of the first semiconductor layer 200, the active layer 310, the second semiconductor layer 410, the transparent electrode 710, the first metal electrode 510, and the second metal electrode 520 on the substrate 100, formation of the conductor 610 by applying the breakdown voltage, and formation of the recess 615 in the conductor 610 by applying the recess voltage or performing the thermal treatment.

FIGS. 4A, 4B, 4C, 4D, 4E, and 4F are views illustrating current-voltage characteristic graphs of the first light emitting diode and the second light emitting diodes manufactured by applying the recess voltage. FIGS. 5A and 5B are views illustrating current-light output power characteristic graphs of the first light emitting diode and the second light emitting diodes manufactured by applying the recess voltage.

The graphs of FIGS. 4A, 4B, 4C, 4D, 4E, 4F, 5A, and 5B may show results obtained by measuring current-voltage characteristics and current-emission characteristics by manufacturing the first light emitting diode and the second light emitting diodes. Each of the second light emitting diodes is manufactured by applying a recess voltage greater than a breakdown voltage of a light emitting diode after manufacturing the same light emitting diode as the first light emitting diode.

Referring to FIGS. 4A, 4B, 4C, 4D and 4E, current-voltage characteristic graphs when a voltage of about −20 V to about 20 V is applied after the DC power is connected to a first light emitting diode S1, a second light emitting diode S2 manufactured by applying a recess voltage greater about 30 V than the breakdown voltage, a second light emitting diode S3 manufactured by applying a recess voltage greater about 60 V than the breakdown voltage, a second light emitting diode S4 manufactured by applying a recess voltage greater about 90 V than the breakdown voltage, a second light emitting diode S5 manufactured by applying a recess voltage greater about 120 V than the breakdown voltage, and a second light emitting diode S6 manufactured by applying a recess voltage greater about 150 V than the breakdown voltage may be confirmed. An X-axis voltage is based on a voltage applied to the second metal electrode 520.

Referring to the graphs of FIGS. 4A, 4B, 4C, 4D, and 4E, it is confirmed that inclinations of the graphs are changed by using a threshold voltage Vb as a boundary. When the voltage is less than the threshold voltage Vb, current may flow by the first and second metal electrodes 510 and 520, the conductor 610, and the first semiconductor layer 200. When the voltage is greater than the threshold voltage Vb, current may also flow by the second semiconductor layer 410 and the active layer 310 in addition to the first and second metal electrodes 510 and 520, the conductor 610, and the first semiconductor layer 200. Thus, when the voltage is greater than the threshold voltage Vb, light may be emitted from the active layer 310.

In FIGS. 4A, 4B, 4C, 4D and 4E, it may be confirmed that an inclination of the first light emitting diode S1 is greater than that of each of the graphs of the second light emitting diodes S2, S3, S4, S5 and S6 within a range in which the voltage is less than the threshold voltage Vb. Thus, it may be confirmed that each of the conductors including the recesses of the second light emitting diodes S2, S3, S4, S5, and S6 has electrical resistance less than that of the conductor including the inner protrusion of the first light emitting diode S1.

Figure 4A:
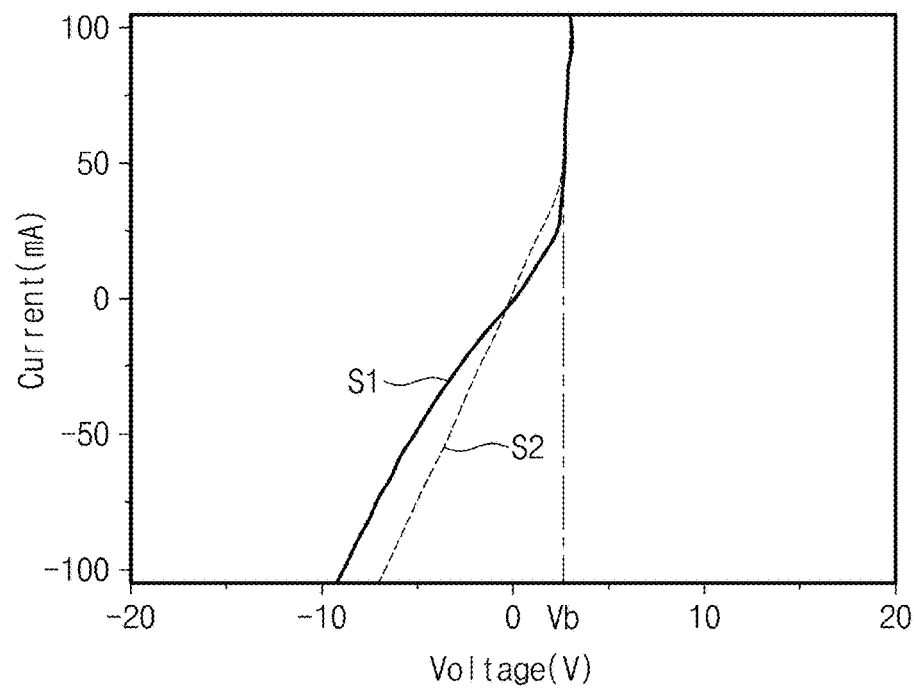
FIGS. 4A, 4B, 4C, 4D, 4E, and 4F are views illustrating current-voltage characteristic graphs of the first light emitting diode and the second light emitting diodes manufactured by applying a recess voltage.
Figure 4B:
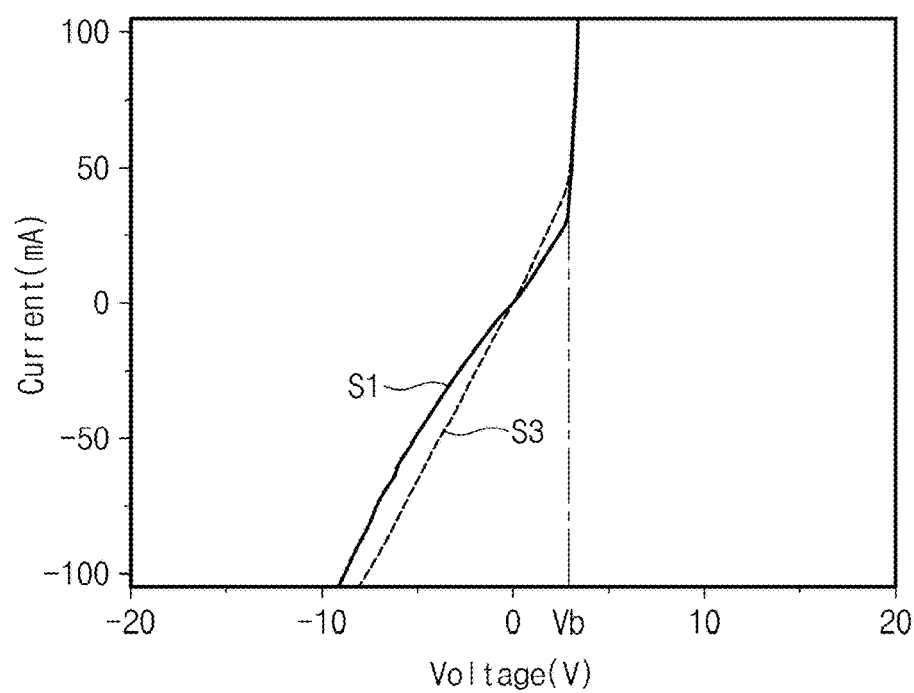
Figure 4C:
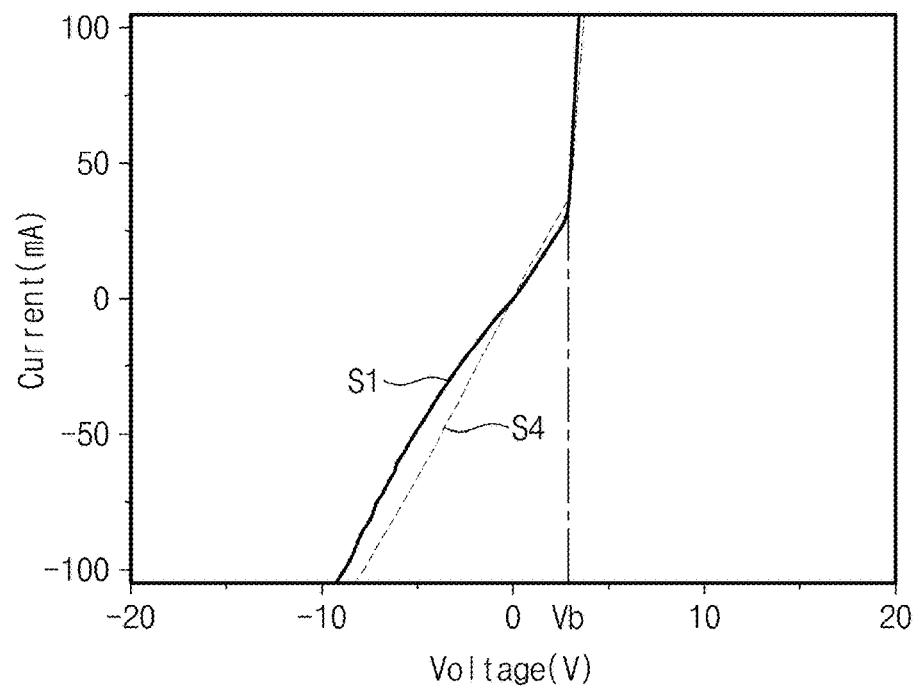
Figure 4D:
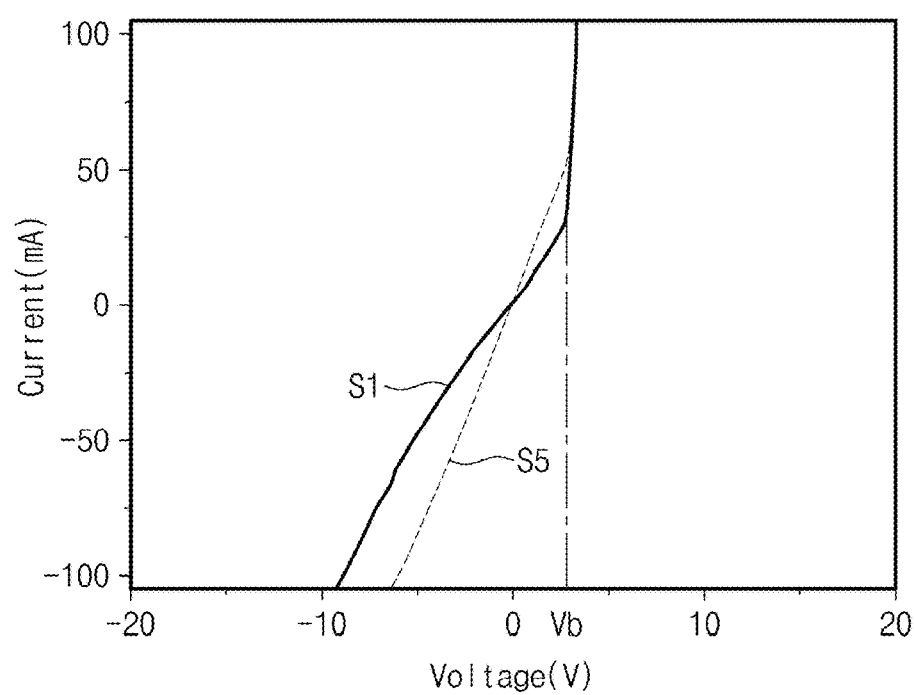
Figure 4E:
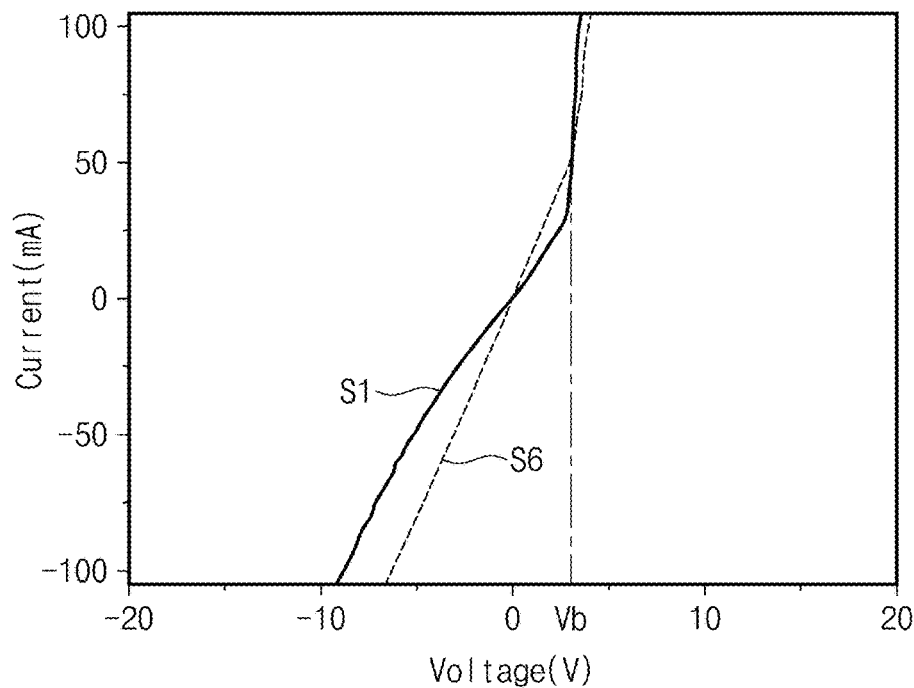
Figure 4F:
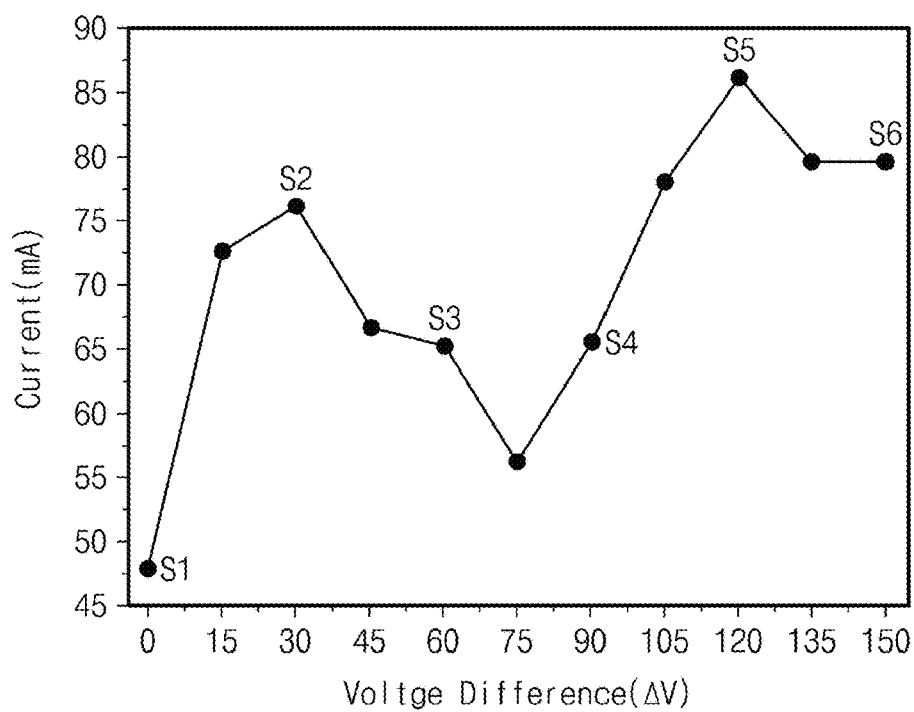
Figure 5A:
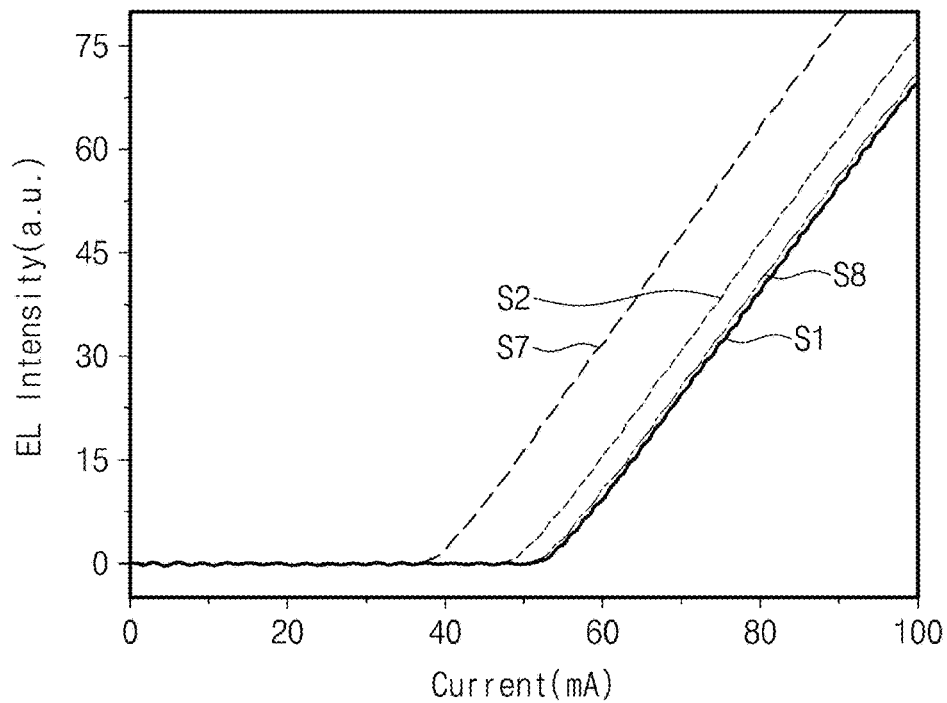
FIGS. 5A and 5B are views illustrating current-light output power characteristic graphs of the first light emitting diode and the second light emitting diodes manufactured by applying the recess voltage.
Figure 5B:
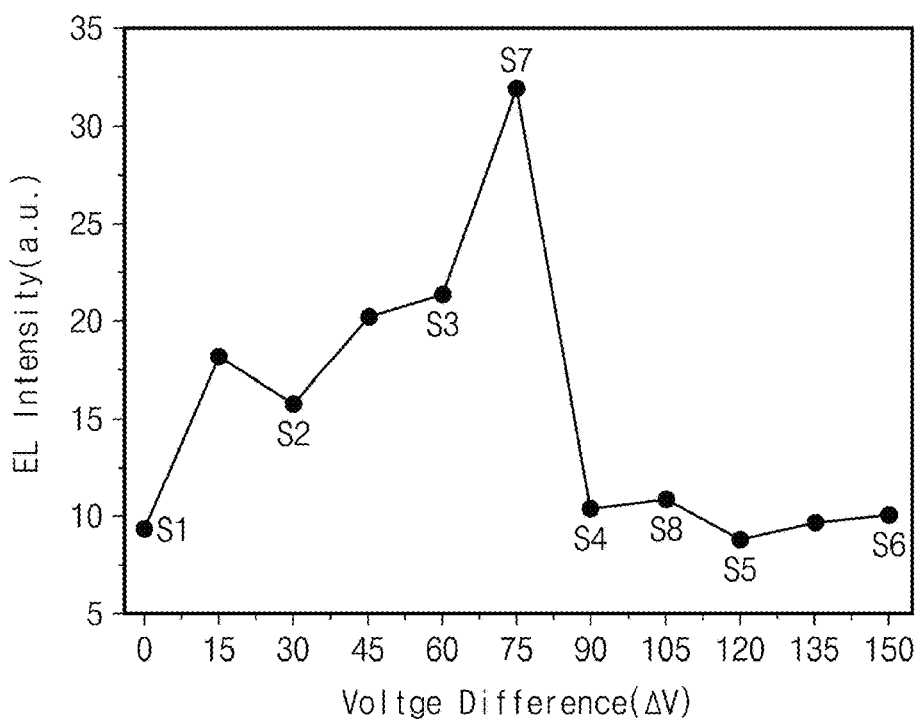

In FIG. 4F, current when a voltage of about −5 V (based on a voltage applied to the second metal electrode 520) applied to the first light emitting diode S1 and the second light emitting diodes manufactured by applying a recess voltage that is grater about 15 V to about 150 V than the breakdown voltage may be confirmed. In FIG. 4F, the X axis represents a voltage difference between the breakdown voltage and the recess voltage. It may be confirmed that even though the same voltage is applied, the current flowing through the second light emitting diodes is greater than that flowing through the first light emitting diode S1 (i.e., the current-voltage characteristics are good). It may be confirmed that the second light emitting diodes manufactured by applying a recess voltage that is greater about 15 V to about 30 V than the breakdown voltage and the second light emitting diodes manufactured by applying the recess voltage that is greater about 105 V to about 150 V than the breakdown voltage have relatively good current-voltage characteristics. It may be confirmed that the second light emitting diodes manufactured by applying a recess voltage that is greater about 45 V to about 90 V than the breakdown voltage have relatively poor current-voltage characteristics.

Referring to FIG. 5A, current-light output power characteristic graphs when the DC power is applied to the first light emitting diode S1, the second light emitting diode S2 manufactured by applying a recess voltage that is greater about 30 V than the breakdown voltage, the second light emitting diode S7 manufactured by applying a recess voltage that is greater about 75 V than the breakdown voltage, and the second light emitting diode S8 manufactured by applying a recess voltage that is greater than about 105 V than the breakdown voltage may be confirmed. The X-axis current is based on current flowing from the second metal electrode 520 to the first metal electrode 510.

Referring to FIG. 5A, it may be confirmed that an intensity of current flowing through the second light emitting diodes S2, S7, and S8 is less than that of current flowing the first light emitting diode S1. Thus, it may be confirmed that the second light emitting diodes S2, S7, and S8 manufactured by applying the recess voltage have improved current-light output power characteristics.

In FIG. 5B, intensity of light emission when current of about 60 mA (current flowing from the second metal electrode 520 to the first metal electrode 510) flows the first light emitting diode S1 and the second light emitting diodes manufactured by applying a recess voltage that is greater about 15 V to about 150 V than the breakdown voltage may be confirmed. In FIG. 5B, the X axis represents a voltage difference between the breakdown voltage and the recess voltage.

It may be confirmed that even though the same current flows, intensity of light emission of the second light emitting diodes manufactured by applying a recess voltage that is greater about 15 V to about 75 V than the breakdown voltage is greater than that of light emission of the first light emitting diode S1. However, it may be confirmed that a difference in intensity of light emission between the second light emitting diodes manufactured by applying a recess voltage that is greater about 90V to about 150V than the breakdown voltage and the first light emitting diode S1 is not large. In the case of the second light emitting diodes manufactured by applying a recess voltage that is greater about 90 V to about 150 V than the breakdown voltage, a depth of the recess 615 of the conductor 610 may be too deep by the excessive recess voltage to reduce an amount of a conductive material, and defects may occur around the channel CH to cause an electrical loss to deteriorate the light emission characteristics.

Figure 6:
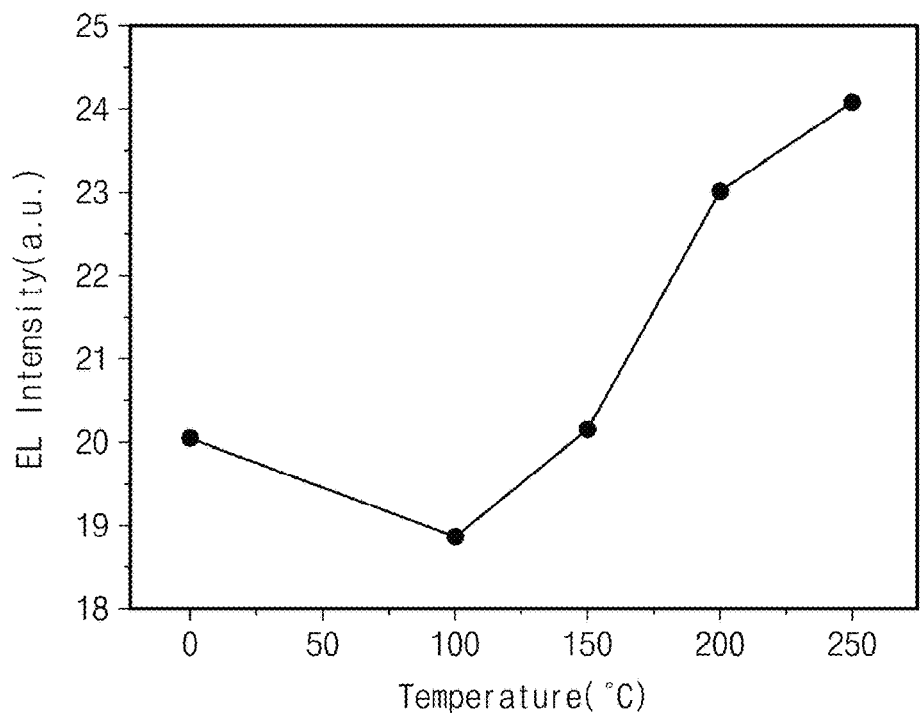
FIG. 6 is a view for explaining electroluminescence characteristics of the first light emitting diode and the second light emitting diodes manufactured through heat treatment.

FIG. 6 is a view for explaining electroluminescence characteristics of the first light emitting diode and the second light emitting diodes manufactured through heat treatment.

The graph of FIG. 6 illustrates results obtained by measuring electroluminescence characteristics by manufacturing the first light emitting diode and the second light emitting diodes. Each of the second light emitting diodes is manufactured by thermally treating the same light emitting diode as the first light emitting diode.

Referring to FIG. 6, it may be confirmed that the second light emitting diodes manufactured by being thermally treated at a temperature of about 100° C. to about 150° C. have relatively poor electroluminescence characteristics when compared to the first light emitting diode. It may be confirmed that the second light emitting diodes manufactured by being thermally treated at a temperature of about 200° C. to about 250° C. have relatively good electroluminescence characteristics when compared to the first light emitting diode. Consequently, when the thermal treatment is performed at a temperature of about 200° C. or more, the recess may be formed in the conductor of the light emitting diode, and the electrical resistance of the conductor may be reduced.

FIGS. 7A, 7B, 7C, 7D, and 7E are optical microscope images of the conductor.

Referring to 7A, 7B, 7C, 7D, and 7E, a change in shape of the conductor according to the thermal treatment may be confirmed.

Figure 7A:
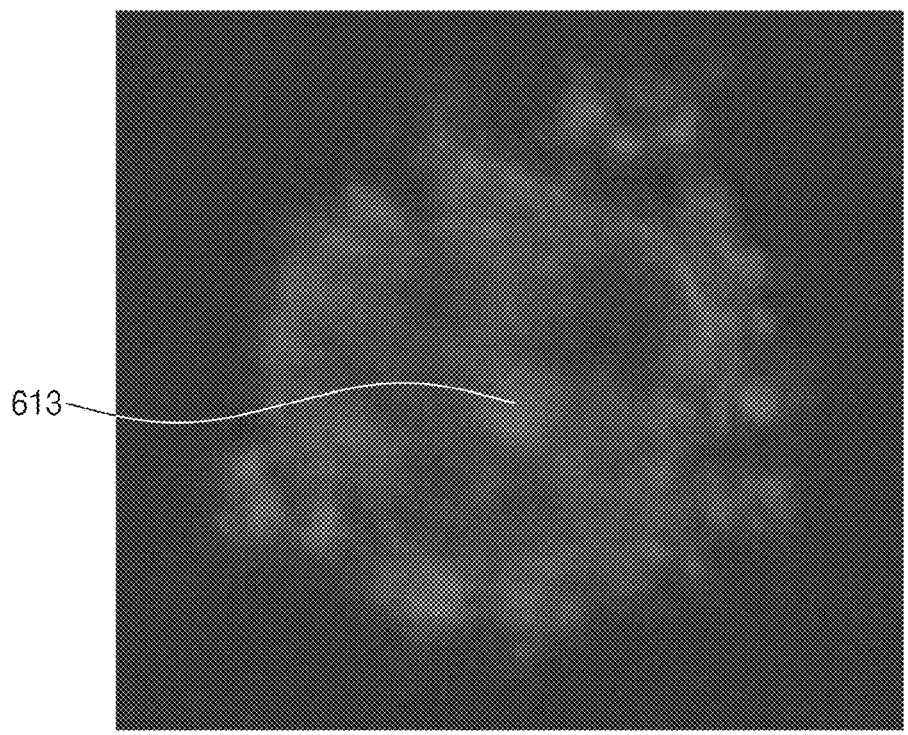
FIGS. 7A, 7B, 7C, 7D, and 7E are optical microscope images of the conductor.
Figure 7B:
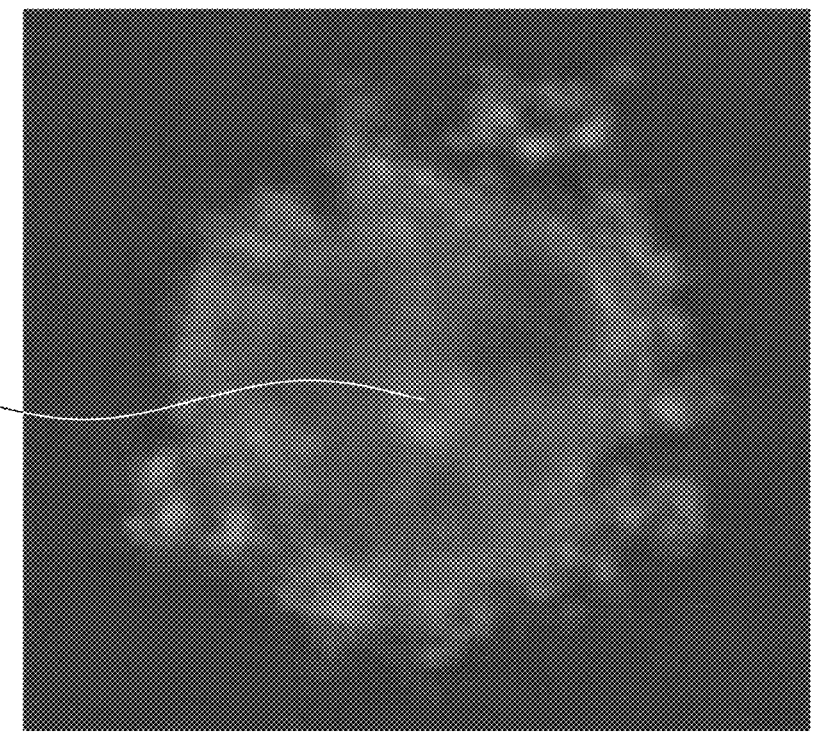
Figure 7C:
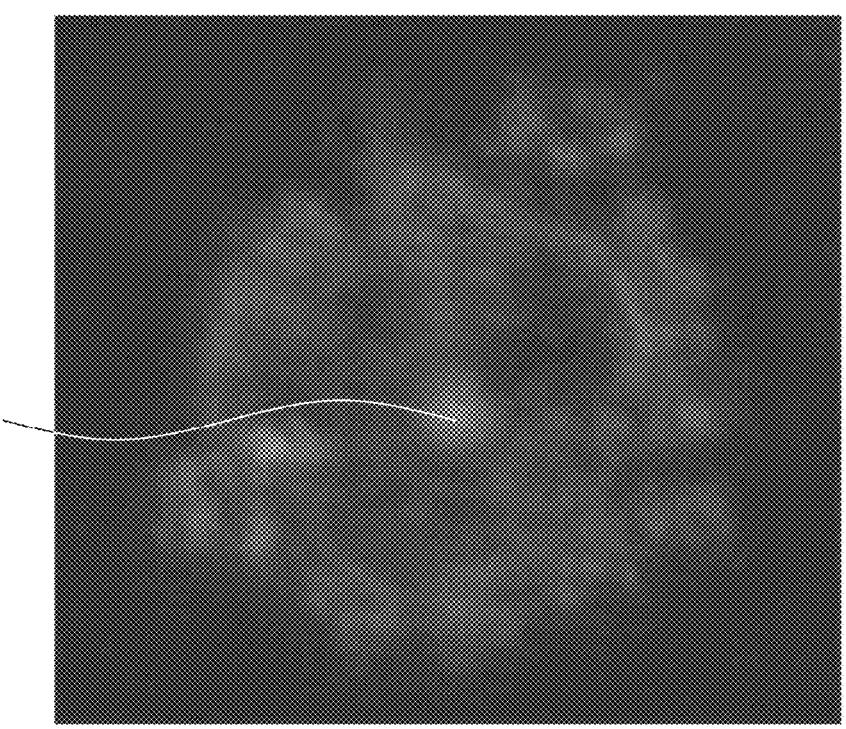
Figure 7D:
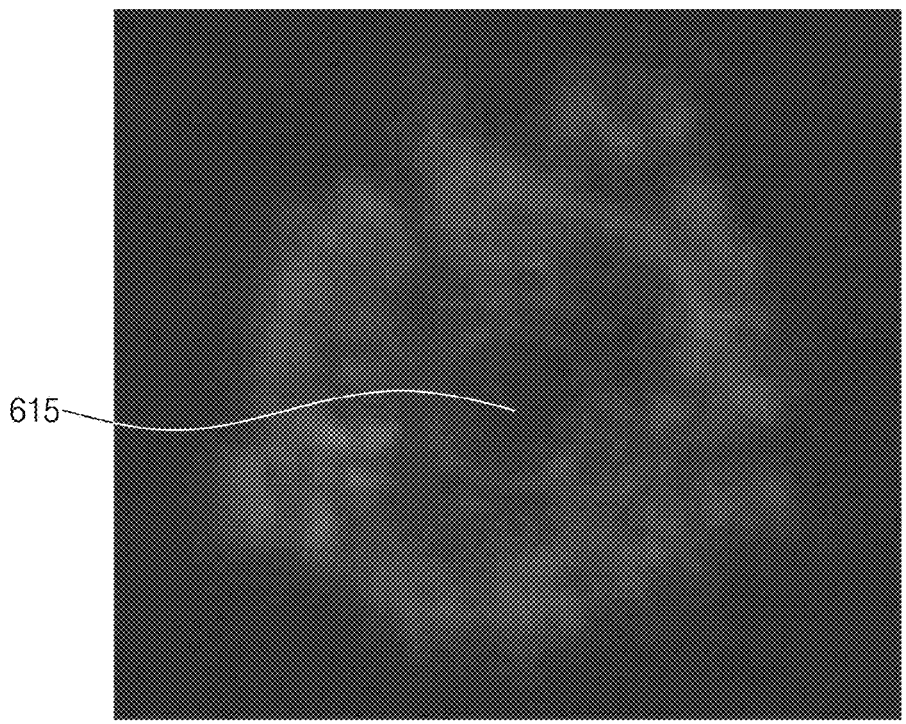
Figure 7E:
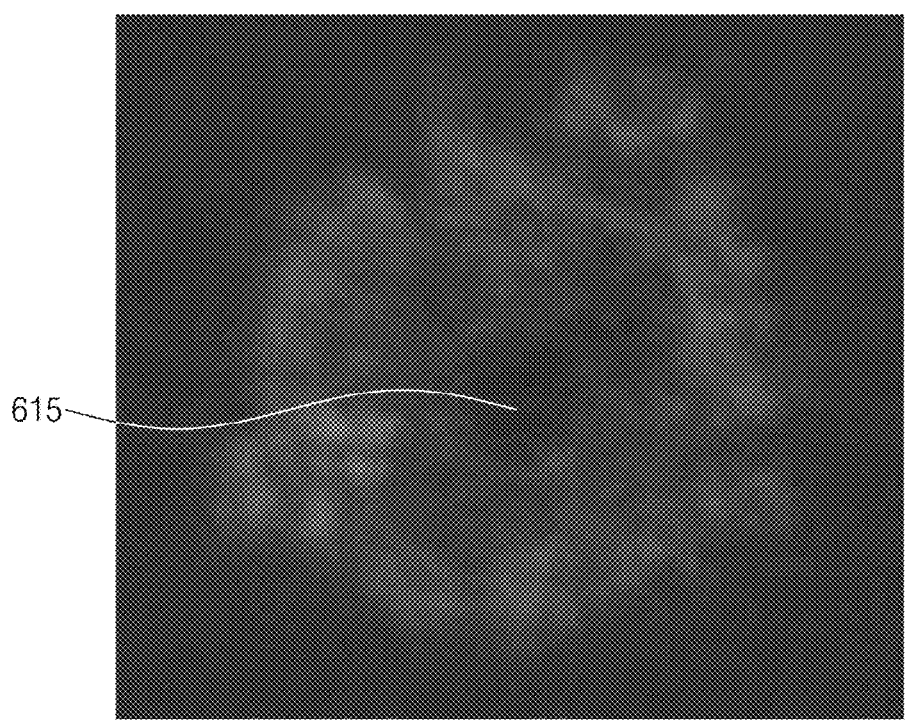

FIG. 7A is an optical microscope image of the conductor that is not thermally treated, FIG. 7B is an optical microscope image of the conductor that is thermally treated at a temperature of about 100° C., FIG. 7C is an optical microscope image of the conductor that is thermally treated at a temperature of about 150° C., FIG. 7D is an optical microscope image of the conductor that is thermally treated at a temperature of about 200° C., and FIG. 7E is an optical microscope image of the conductor that is thermally treated at a temperature of about 250° C.

Referring to FIGS. 7A, 7B, 7C, 7D, and 7E, it may be confirmed that the inner protrusion 613 remains on the conductor that is not thermally treated and the conductors that are thermally treated at temperatures of about 100° C. and about 150° C., and it may be confirmed that the inner protrusion 613 is removed from the conductors that are thermally treated at a temperature of about 200° C. and about 250° C., and the recess 615 is formed.

FIG. 8 is a cross-sectional view of a third light emitting diode according to an embodiment of the inventive concept; The third light emitting diode according to the present embodiment is similar to the first light emitting diode described with reference to FIGS. 1A, 1B, and 1C except for following description.

Referring to FIG. 8, the third light emitting diode according to the present embodiment may include a substrate 100, a first semiconductor layer 200, a second semiconductor layer 410, a third semiconductor layer 420, a first active layer 310, a second active layer 320, a first metal electrode 510, a second metal electrode 520, a first conductor 610, a second conductor 620, a first transparent electrode 710, a second transparent electrode 720, and channels CH.

The first and second active layers 310 and 320 may be disposed on the first semiconductor layer 200. The first and second active layers 310 and 320 may be spaced apart from each other in the first direction D1 on the first semiconductor layer 200. Each of the first and second active layers 310 and 320 may be an area from which light is emitted. Each of the first and second active layers 310 and 320 may have a single or multiple quantum well structure. For example, each of the first and second active layers 310 and 320 may include at least one of GaN, GaP, GaAs, GaSb, AlN, AlP, AlAs, AlSb, InN, InP, InAs, InSb, AlGaN, AlGaP, AlGaAs, AlGaSb, InGaN, GaInP, GaInAs, GaInSb, AlInN, AlInP, AlInAs, AlInSb, AlGaInN, AlGaInP, AlGaInAs, or AlGaInSb.

The second semiconductor layer 410 may be disposed on the first active layer 310, and the third semiconductor layer 420 may be disposed on the second active layer 320. The second and third semiconductor layers 410 and 420 may be spaced apart from each other in the first direction D1. For example, each of the second and third semiconductor layers 410 and 420 may include at least one of GaN, GaAs, GaSb, AlN, AlP, AlAs, AlSb, InN, InP, InAs, InSb, AlGaN, AlGaP, AlGaAs, AlGaSb, InGaN, GaInP, GaInAs, GaInSb, AlInN, AlInP, AlInAs, AlInSb, AlGaInN, AlGaInP, AlGaInAs, or AlGaInSb.

For example, each of the second and third semiconductor layers 410 and 420 may be a P-type semiconductor layer, and the first semiconductor layer 200 may be an N-type semiconductor layer. For another example, each of the second and third semiconductor layers 410 and 420 may be a P-type semiconductor layer, and the first semiconductor layer 200 may be an intrinsic semiconductor layer. For further another example, each of the second and third semiconductor layers 410 and 420 may be an N-type semiconductor layer, and the first semiconductor layer 200 may be a P-type semiconductor layer. For another example, each of the second and third semiconductor layers 410 and 420 may be an N-type semiconductor layer, and the first semiconductor layer 200 may be an intrinsic semiconductor layer. Hereinafter, the case in which each of the second and third semiconductor layers 410 and 420 is the P-type semiconductor layer, and the first semiconductor layer 200 is the N-type semiconductor layer will be described.

The first transparent electrode 710 may be disposed on the second semiconductor layer 410, and the second transparent electrode 720 may be disposed on the third semiconductor layer 420. For example, each of the first and second transparent electrodes 710 and 720 may include at least one of indium tin oxide (ITO), zinc-doped indium tin oxide (ZITO), zinc indium oxide (ZIO), gallium indium oxide (GIO), zinc tinoxide (ZTO), fluorine-doped tin oxide (FTO), aluminum-doped zinc oxide (AZO), gallium-doped zinc oxide (GZO), or transparent conductive oxide (TCO).

The first metal electrode 510 may be disposed on the first transparent electrode 710, and the second metal electrode 520 may be disposed on the second transparent electrode 720. The first metal electrode 510 may cover a portion of a top surface of the first transparent electrode 710. The second metal electrode 520 may cover a portion of a top surface of the second transparent electrode 720.

The channel CH passing through the first transparent electrode 710, the second semiconductor layer 410, and the first active layer 310 and the channel CH passing through the second transparent electrode 720, the third semiconductor layer 420, and the second active layer 320 may be provided. The first conductor 610 passing through the first transparent electrode 710, the second semiconductor layer 410, and the first active layer 310 and electrically connected to the first semiconductor layer 200 may be provided. The second conductor 620 passing through the second transparent electrode 720, the third semiconductor layer 420, and the second active layer 320 and electrically connected to the first semiconductor layer 200 may be provided. The first and second conductors 610 and 620 may be filled into the channels CH, respectively. Each of the first and second conductors 610 and 620 may include an inner protrusion.

Figure 9A:
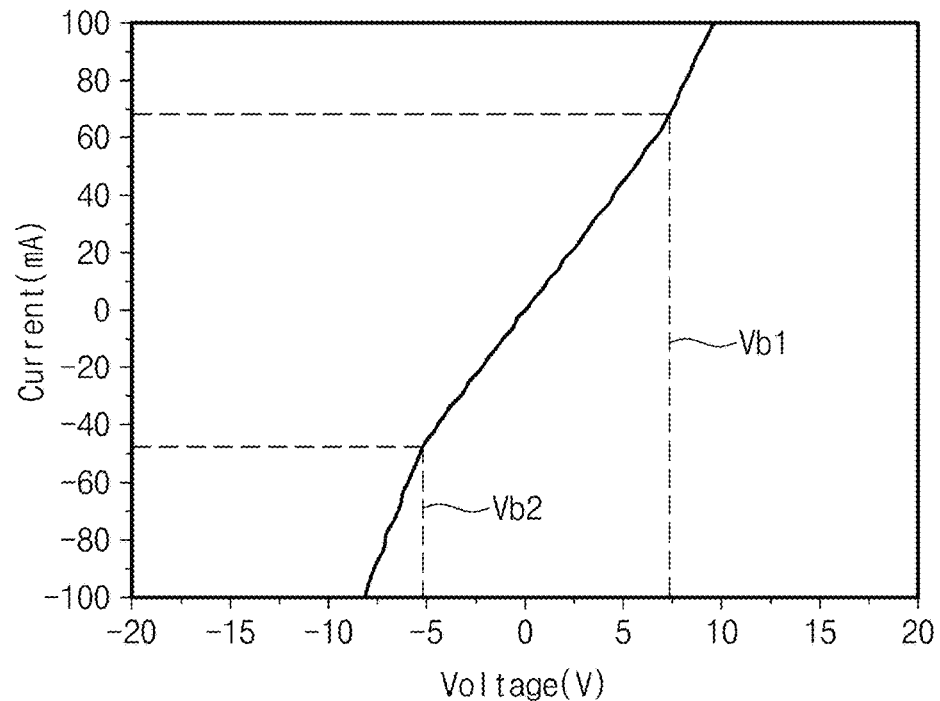
FIG. 9A is a view illustrating a current-voltage characteristic graph of the third light emitting diode.

FIG. 9A is a view illustrating a current-voltage characteristic graph of the third light emitting diode.

Referring to FIG. 9A, when a voltage of about −20 V to about 20 V is applied after DC power is connected to the third light emitting diode, it may be confirmed that the current-voltage characteristic graph of the third light emitting diode is changed in inclination at a first threshold voltage Vb1 and a second threshold voltage Vb2. The current may flow at a voltage between the first and second threshold voltages Vb1 and Vb2 by the first and second metal electrodes 510 and 520, the first and second conductors 610 and 620, and the first semiconductor layer 200. The current may flow at a voltage that is above the first threshold voltage Vb1 and below the second threshold voltage Vb2 by the second and third semiconductor layers 410 and 420 and the first and second active layers 310 and 320 in addition to the first and second metal electrodes 510 and 520, the first and second conductors 610 and 620, and the first semiconductor layer 200. Thus, light may be emitted from the first and second active layers 310 and 320 at a voltage that is above the first threshold voltage Vb1 and below the second threshold voltage Vb2.

Figure 9B:
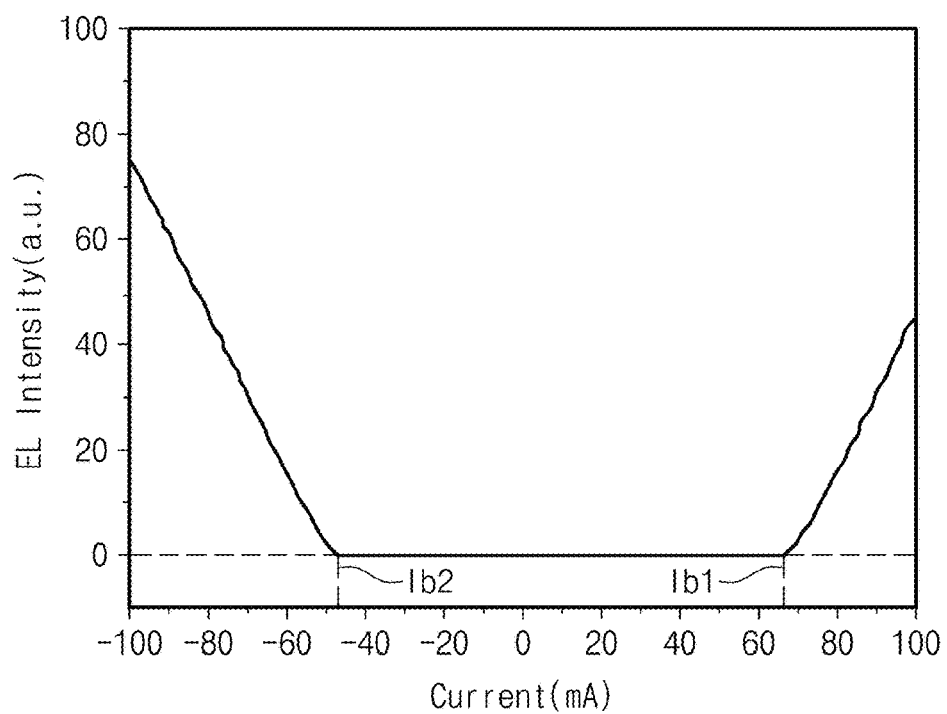
FIG. 9B is a view illustrating a current-light output power characteristic graph of the third light emitting diode.

FIG. 9B is a view illustrating a current-light output power characteristic graph of the third light emitting diode.

Referring to FIG. 9B, when a current of about −100 mA to about 100 mA is applied after the DC power is connected to the third light emitting diode, it is confirmed that the third light emitting diode emits light above a first threshold current lb1 and below a second threshold current lb2. It may be confirmed that absolute intensities of the first threshold current lb1 and the second threshold current lb2 are different from each other. The different absolute intensities of the first threshold current lb1 and the second threshold current lb2 may be because electrical resistances of the first and second conductors 610 and 620 are different from each other. The different electrical resistance of the first and second conductors 610 and 620 may be because sizes, shapes, and positions of the first and second conductors 610 and 620 are different from each other.

Figure 10:
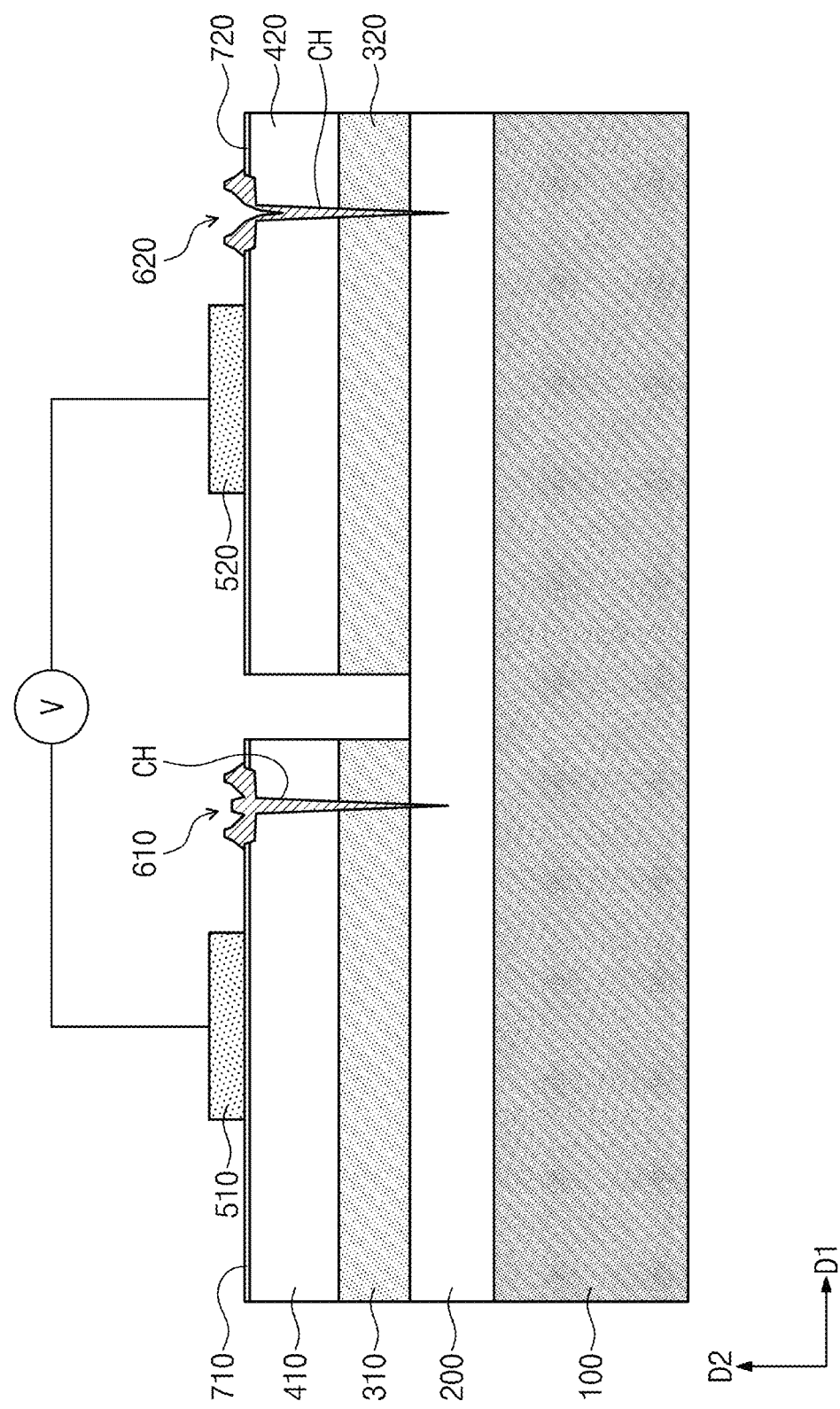
FIG. 10 is a cross-sectional view of a fourth light emitting diode according to an embodiment of the inventive concept.

FIG. 10 is a cross-sectional view of a fourth light emitting diode according to an embodiment of the inventive concept. The fourth light emitting diode according to the present embodiment is similar to the third light emitting diode described with reference to FIG. 8 except for following description.

Referring to FIG. 10, the first conductor 610 may include an inner protrusion, and the second conductor 620 may include a recess. In the fourth light emitting diode according to the present embodiment, a recess may be formed in the second conductor 620 by applying a recess voltage to the third light emitting diode of FIG. 8. Alternatively, in the fourth light emitting diode according to the present embodiment, a recess may be formed in the second conductor 620 by thermally treating the third light emitting diode of FIG. 8.

Figure 11:
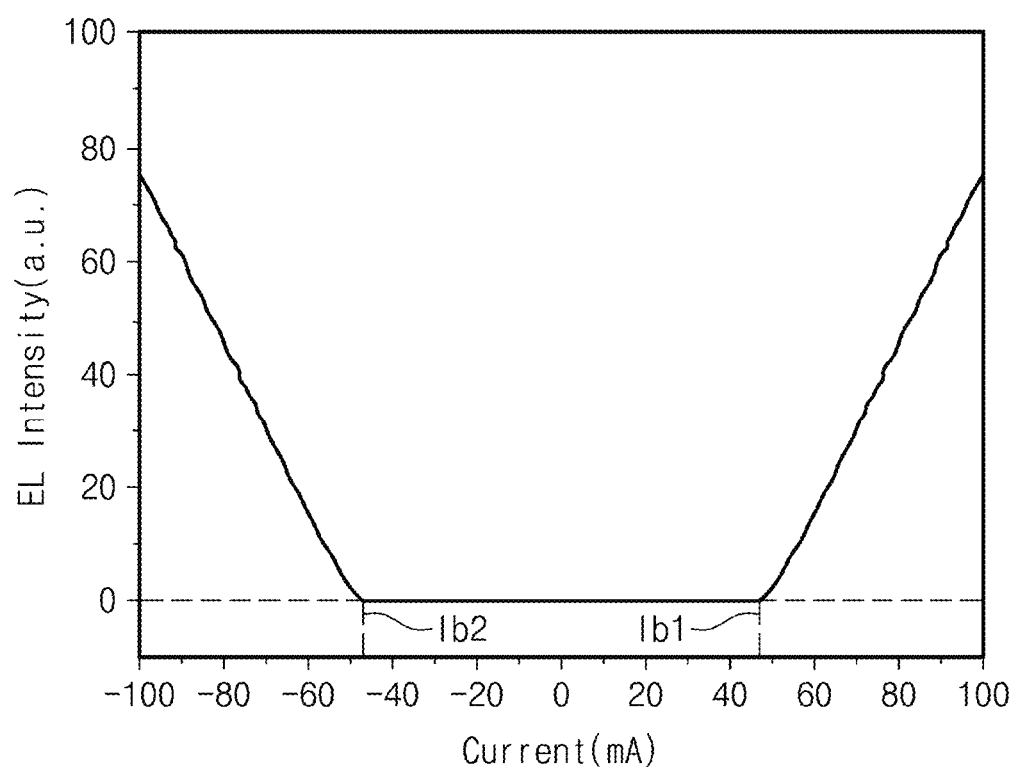
FIG. 11 is a view illustrating a current-light output power characteristic graph of the fourth light emitting diode.

FIG. 11 is a view illustrating a current-light output power characteristic graph of the fourth light emitting diode.

Referring to FIG. 11, it may be confirmed that the fourth light emitting diode emits light below the first threshold current lb1 and above the second threshold current lb2. It may be confirmed that absolute intensities of the first threshold current lb1 and the second threshold current lb2 are substantially the same. Thus, it may be confirmed that electrical resistance of the first and second conductors 610 and 620 are substantially the same.

Referring to FIGS. 8, 9B, 10, and 11, in the case in which AC power is connected to the third light emitting diode, since absolute intensities of the first threshold current lb1 and the second threshold current lb2 are different from each other, the third light emitting diode may not uniformly emit light.

Also, in the case in which the AC power is connected to the fourth light emitting diode, since the absolute intensities of the first threshold current lb1 and the second threshold current lb2 are the same, the fourth light emitting diode may uniformly emit light.

A recess voltage may be applied to the third light emitting diode, or thermal treatment may be performed on the third light emitting diode to change electrical characteristics of one of the two conductors, thereby manufacturing the fourth light emitting diode having the uniform light emission characteristic.

Figure 12:
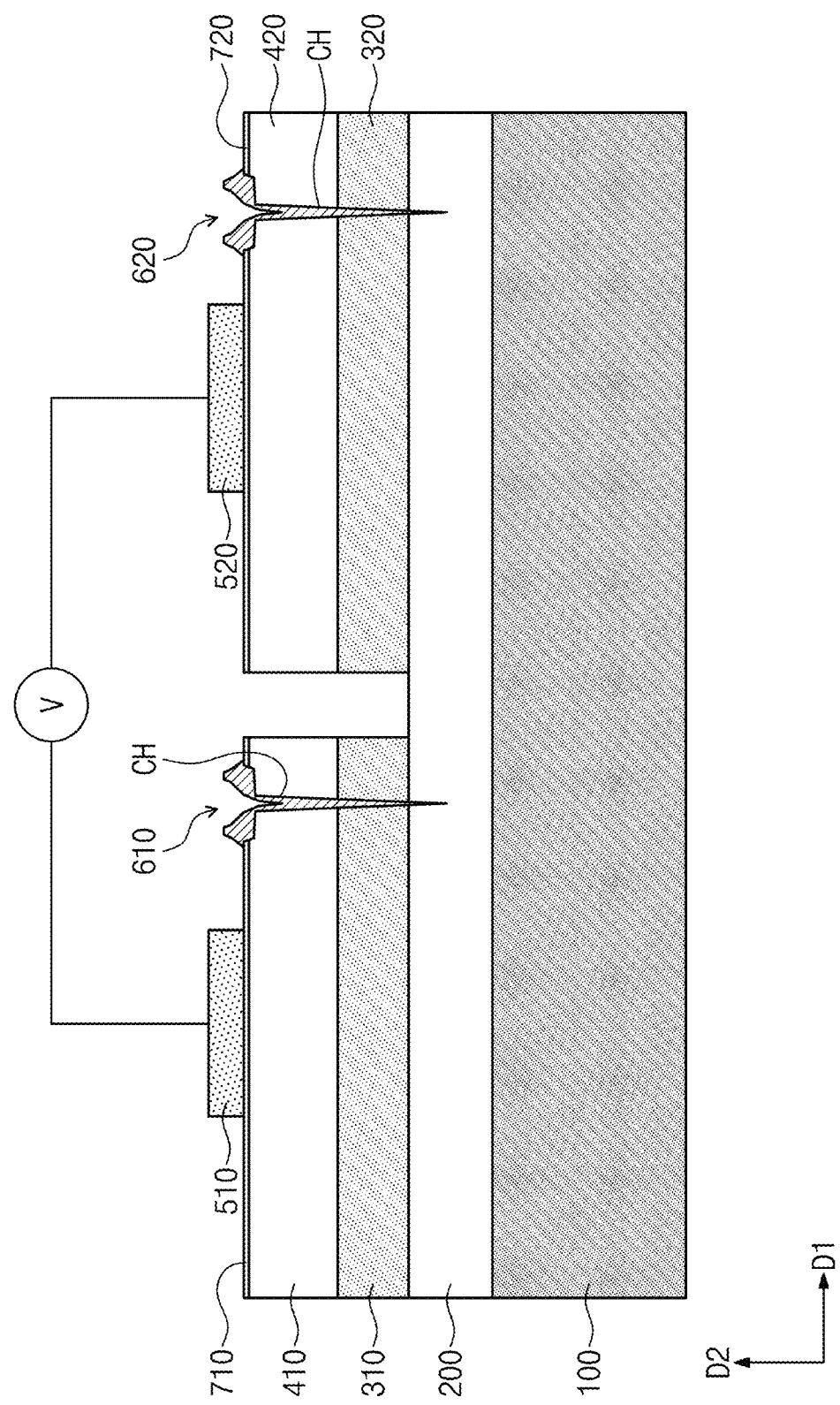
FIG. 12 is a cross-sectional view of a fifth light emitting diode according to an embodiment of the inventive concept.

FIG. 12 is a cross-sectional view of a fifth light emitting diode according to an embodiment of the inventive concept. The fifth light emitting diode according to the present embodiment is similar to the third light emitting diode described with reference to FIG. 8 except for following description.

Referring to FIG. 12, each of the first conductor 610 and the second conductor 620 may include a recess. In the fifth light emitting diode according to the present embodiment, a recess may be formed in each of the first and second conductors 610 and 620 by applying a recess voltage to the third light emitting diode of FIG. 8. Alternatively, in the fifth light emitting diode according to the present embodiment, the third light emitting diode of FIG. 8 may be thermally treated to form a recess in each of the first and second conductors 610 and 620.

In the case of the fifth light emitting diode, when compared to the third light emitting diode of FIG. 8, the electrical resistance of the first and second conductors 610 and 620 may be reduced.

Figure 13:
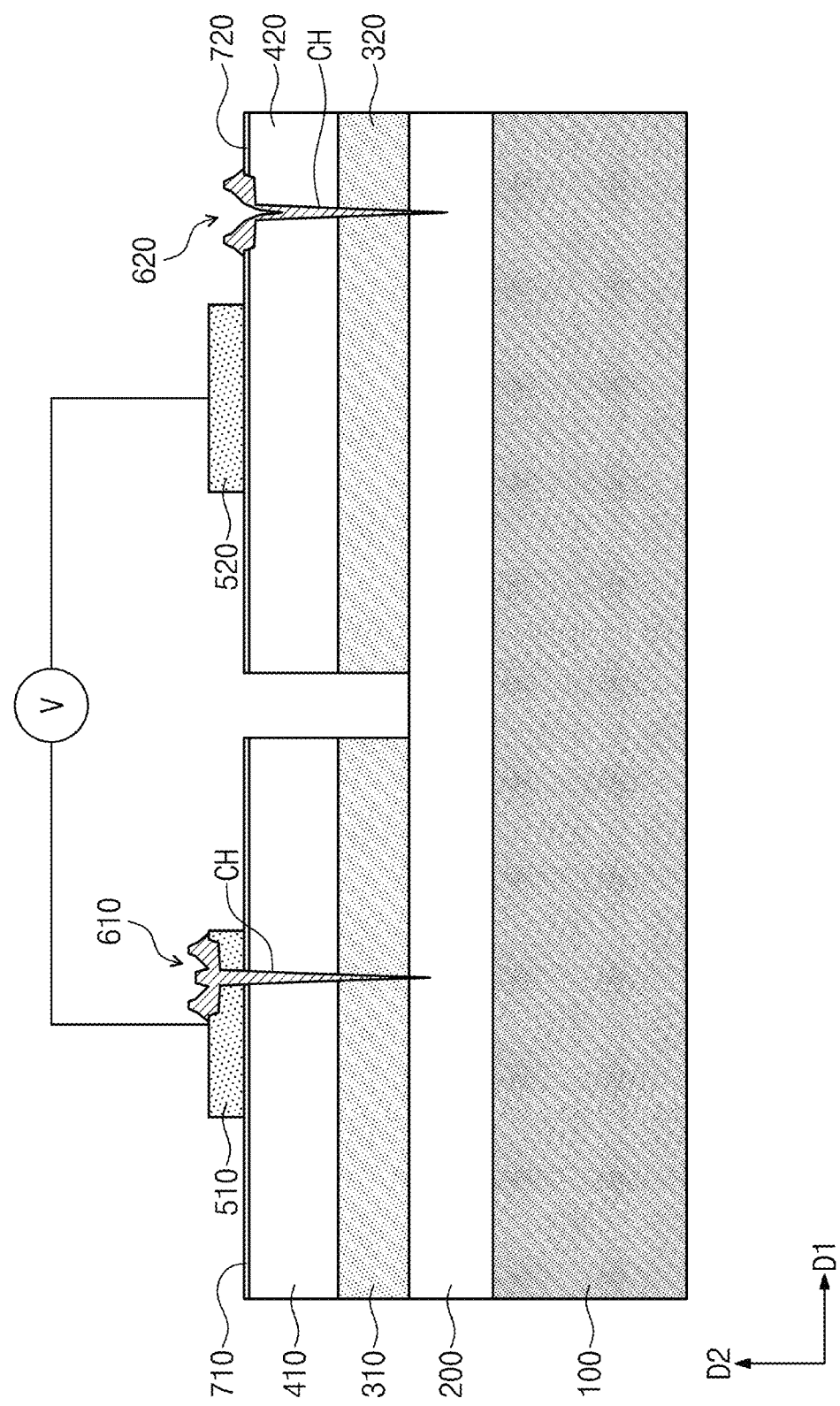
FIG. 13 is a cross-sectional view of a sixth light emitting diode according to an embodiment of the inventive concept.

FIG. 13 is a cross-sectional view of a sixth light emitting diode according to an embodiment of the inventive concept. The sixth light emitting diode according to the present embodiment is similar to the third light emitting diode described with reference to FIG. 8 except for following description.

Referring to FIG. 13, a channel CH passing through the first metal electrode 510, the first transparent electrode 710, the second semiconductor layer 410, and the first active layer 310 may be provided. The first conductor 610 may pass through the first metal electrode 510, the first transparent electrode 710, the second semiconductor layer 410, and the first active layer 310 and then be electrically connected to the first semiconductor layer 200.

The second conductor 620 may include a recess.

FIG. 14 is a cross-sectional view of a seventh light emitting diode according to an embodiment of the inventive concept. The seventh light emitting diode according to the present embodiment is similar to the third light emitting diode described with reference to FIG. 8 except for following description.

Referring to FIG. 14, a channel passing through the first active layer 310, the second semiconductor layer 410, or the first transparent electrode 710 may not be provided. A conductor passing through the first active layer 310, the second semiconductor layer 410, or the first transparent electrode 710 may not be provided. A conductor 620 passing through the second active layer 320, the third semiconductor layer 420, and the second transparent electrode 720 may be provided. The conductor 620 may include a recess.

DC power may be applied to the seventh light emitting diode according to the present embodiment.

The light emitting diode according to the inventive concept may include the conductor to emit light by the DC and AC power.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:
1. A light emitting diode comprising:
a substrate;
a first semiconductor layer on the substrate;
an active layer on the first semiconductor layer;
a second semiconductor layer on the active layer; and a conductor passing through the second semiconductor layer and the active layer to contact the first semiconductor layer, wherein the conductor comprises a recess in an upper portion thereof, and a lowermost portion of the recess is provided within the second semiconductor layer.

2. The light emitting diode of claim 1, wherein the conductor comprises a base part passing through the second semiconductor layer and the active layer and a through-part protruding from the base part in a first direction, and a lowermost portion of the base part has a level higher than that of the lowermost portion of the through-part.

3. The light emitting diode of claim 2, wherein the through-part has a width less than that of the base part.

4. The light emitting diode of claim 2, wherein the conductor further comprises an outer protrusion from an edge of the base part in a second direction, and the second direction is a direction opposite to the first direction.

5. The light emitting diode of claim 1, wherein the conductor is formed by a breakdown voltage, and the recess is formed by applying a voltage greater than the breakdown voltage to the conductor.

6. The light emitting diode of claim 1, wherein the conductor is formed by a breakdown voltage, and the recess is formed by thermally treating the conductor.

7. A light emitting diode comprising:
a substrate;
a first semiconductor layer on the substrate;
first and second active layers disposed on the first semiconductor layer and spaced apart from each other;
a second semiconductor layer on the first active layer;
a third semiconductor layer on the second active layer;
a first conductor passing through the second semiconductor layer and the first active layer and electrically connected to the first semiconductor layer; and
a second conductor passing through the third semiconductor layer and the second active layer and electrically connected to the first semiconductor layer,
wherein each of the first and second conductors comprises a base part and a through-part protruding from the base part in a first direction,
the through-part of the first conductor passes through the second semiconductor layer and the first active layer to contact the first semiconductor layer, and
the through-part of the second conductor passes through the third semiconductor layer and the second active layer to contact the first semiconductor layer.

8. The light emitting diode of claim 7, wherein each of the second and third semiconductor layers is a P-type semiconductor layer, and the first semiconductor layer is an N-type semiconductor layer.

9. The light emitting diode of claim 7, wherein the first conductor comprises a recess in an upper portion thereof, and a lowermost portion of the recess is provided within the second semiconductor layer.

10. The light emitting diode of claim 7, wherein each of the first and second conductors comprises an outer protrusion protruding from the base part in a second direction, and the second direction is a direction opposite to the first direction.

11. The light emitting diode of claim 10, wherein the first conductor further comprises an inner protrusion surrounded by the outer protrusion of the first conductor in a planar manner, and the second conductor further comprises a recess surrounded by the outer protrusion of the second conductor in a planar manner.

12. The light emitting diode of claim 11, wherein an uppermost portion of the outer protrusion of the first conductor has a level higher than that of an uppermost portion of the inner protrusion of the first conductor.

13. The light emitting diode of claim 7, further comprising:

a first metal electrode on the second semiconductor layer; and a second metal electrode on the third semiconductor layer,
wherein the first conductor passes through the first metal electrode.

14. The light emitting diode of claim 13, further comprising:

a first transparent electrode between the second semiconductor layer and the first metal electrode; and a second transparent electrode between the third semiconductor layer and the second metal electrode.

15. The light emitting diode of claim 7, wherein lowermost portions of the through-parts of the first and second conductors are provided within the first semiconductor layer.

16. A light emitting diode comprising:
a substrate;
a first semiconductor layer on the substrate;
an active layer on the first semiconductor layer;
a second semiconductor layer on the active layer; and
a conductor passing through the second semiconductor layer and the active layer to contact the first semiconductor layer,
wherein the conductor comprises a base part passing through the second semiconductor layer and the active layer and a through-part protruding from the base part in a first direction, and a lowermost portion of the base part has a level higher than that of the lowermost portion of the through-part,
wherein the conductor further comprises an outer protrusion from an edge of the base part in a second direction, and the second direction is a direction opposite to the first direction,
wherein the conductor further comprises an inner protrusion from a central portion of the base part in the second direction, and
the inner protrusion is surrounded by the outer protrusion in a planar manner.

* * * * *